US011881133B2

(12) United States Patent
Park et al.

(10) Patent No.: US 11,881,133 B2
(45) Date of Patent: Jan. 23, 2024

(54) DISPLAY DEVICE

(71) Applicant: Samsung Display Co., Ltd., Yongin-Si (KR)

(72) Inventors: Ju-Chan Park, Seoul (KR); Sun-Ho Kim, Seongnam-si (KR); Sun-Hee Lee, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 38 days.

(21) Appl. No.: 17/616,702

(22) PCT Filed: Feb. 3, 2020

(86) PCT No.: PCT/KR2020/001578
§ 371 (c)(1),
(2) Date: Dec. 6, 2021

(87) PCT Pub. No.: WO2021/010560
PCT Pub. Date: Jan. 21, 2021

(65) Prior Publication Data
US 2022/0309974 A1 Sep. 29, 2022

(30) Foreign Application Priority Data
Jul. 15, 2019 (KR) .......................... 10-2019-0085171

(51) Int. Cl.
*G09G 3/00* (2006.01)

(52) U.S. Cl.
CPC ..... *G09G 3/035* (2020.08); *G09G 2300/0426* (2013.01); *G09G 2330/028* (2013.01)

(58) Field of Classification Search
CPC ........... G09G 3/035; G09G 2300/0426; H10K 59/131; H10K 59/124; H10K 50/80
See application file for complete search history.

(56) References Cited

U.S. PATENT DOCUMENTS

| 2017/0077447 A1* | 3/2017 | Kang ................... H10K 59/122 |
| 2019/0148476 A1* | 5/2019 | Park ..................... G09G 3/3266 |
| | | 257/40 |

FOREIGN PATENT DOCUMENTS

| CN | 108288637 A | 7/2018 |
| CN | 109166862 A | 1/2019 |
| JP | 2018-060166 A | 4/2018 |
| KR | 10-2012-0067728 A | 6/2012 |
| KR | 10-2017-0039537 A | 4/2017 |
| KR | 10-2018-0036466 A | 4/2018 |
| KR | 10-2019-0047165 A | 5/2019 |
| KR | 10-2019-0064716 A | 6/2019 |

* cited by examiner

*Primary Examiner* — Sardis F Azongha
(74) *Attorney, Agent, or Firm* — Innovation Counsel LLP

(57) ABSTRACT

A display device may include a first pixel area on which a first pixel is disposed, a second pixel area on which a second pixel is disposed, the second pixel area being disposed adjacent to the first pixel area along a first direction, a lower connection line connecting the first pixel and the second pixel, and crossing the first pixel area and the second pixel area, an inorganic insulating layer disposed on the lower connection line and having a groove between the first pixel area and the second pixel area, and an organic insulating layer filling the groove of the inorganic insulating layer.

23 Claims, 19 Drawing Sheets

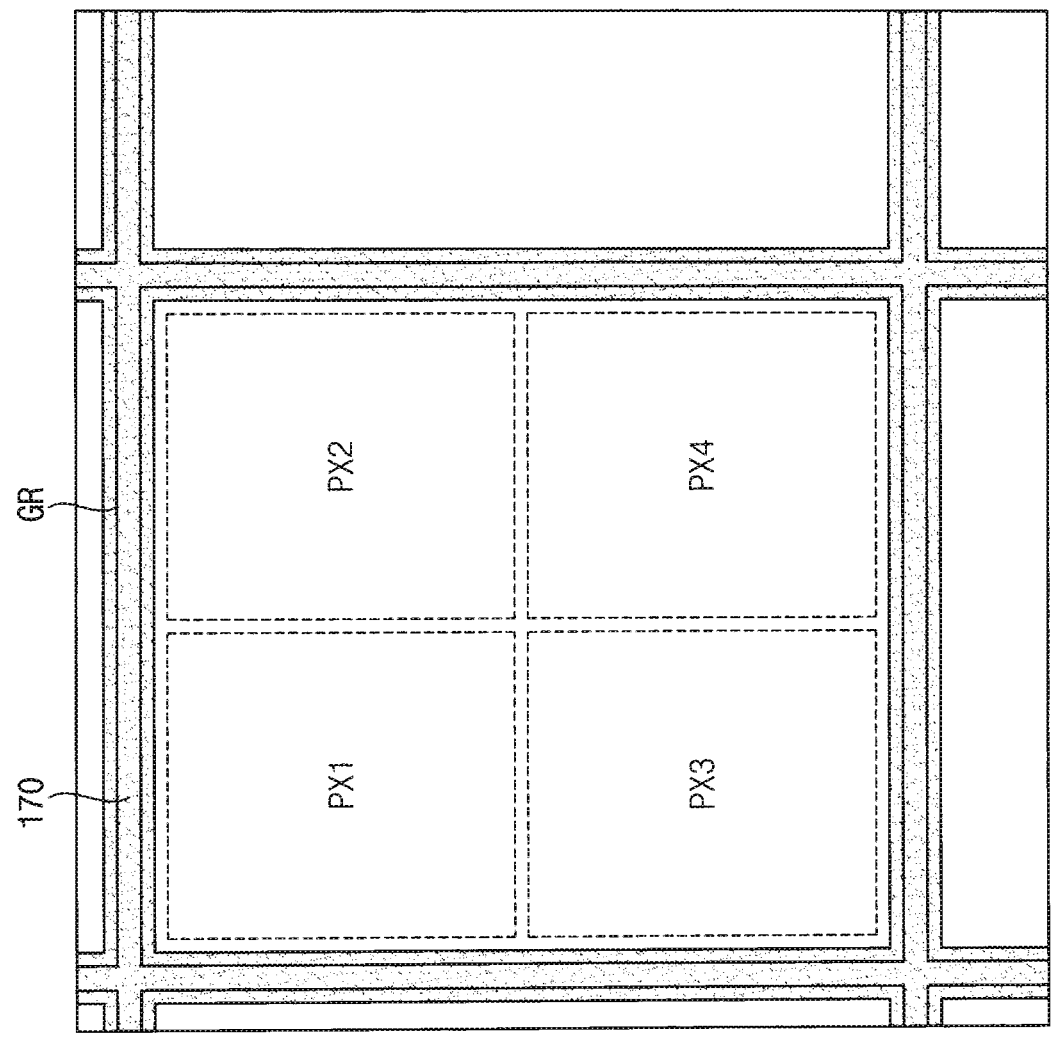

DISPLAY DEVICE

CROSS-REFERENCE TO RELATED APPLICATION(S)

This application is a U.S. national phase application of International Patent Application No. PCT/KR2020/001578, filed on Feb. 3, 2020, which claims priority to Korean Patent Application No. 10-2019-0085171, Jul. 15, 2019, and all the befits accruing therefrom under 35 U.S.C. § 119, the content of which in its entirety is herein incorporated by reference.

BACKGROUND

1. Field

Embodiments relate to a display device. More particularly, embodiments relate to a display device that is robust against external impact.

2. Description of the Related Art

In general, a display device may include a light emitting element and circuit elements for controlling an electrical signal applied to the light emitting element. The circuit elements may include transistors, capacitors, lines, or the like.

To accurately control whether or not the light emitting element emits light and the degree of light emission, the number of transistors electrically connected to one light emitting element is increasing, and the number of lines that transmit electrical signals to the transistors is also increasing. Accordingly, research on a method of implementing high integration of a display device and reducing the occurrence of defects is being actively conducted.

SUMMARY

An object of the present inventive concept is to provide a display device that is robust against external impact.

In order to achieve the object of the present inventive concept described above, a display device may include a first pixel area on which a first pixel is disposed, a second pixel area on which a second pixel is disposed, the second pixel area being disposed adjacent to the first pixel area along a first direction, a lower connection line connecting the first pixel and the second pixel, and crossing the first pixel area and the second pixel area, an inorganic insulating layer disposed on the lower connection line and having a groove between the first pixel area and the second pixel area, and an organic insulating layer filling the groove of the inorganic insulating layer.

In an embodiment, the lower connection line may extend along the first direction. The groove of the inorganic insulating layer may extend along a second direction intersecting the first direction.

In an embodiment, the first pixel and the second pixel may respectively include a first conductive line and a second conductive line disposed on the lower connection line with the organic insulating layer disposed between the first conductive line and the second conductive line.

In an embodiment, the first conductive line and the second conductive line may be connected by the lower connection line.

In an embodiment, the lower connection line may be connected to a scan line or an emission control line.

In an embodiment, the first pixel and the second pixel may respectively include a third conductive line and a fourth conductive line respectively disposed on the lower connection line with the organic insulating layer disposed between the third conductive line and the fourth conductive line.

In an embodiment, the third conductive line and the fourth conductive line may be connected by the lower connection line.

In an embodiment, the lower connection line may be connected to an initialization voltage line.

In an embodiment, the lower connection line may include a first lower connection line connecting the first conductive line and the second conductive line and a second lower connection line connecting the third conductive line and the fourth conductive line.

In an embodiment, an elongation rate of the lower connection line may be greater than an elongation rate of the third conductive line and an elongation rate of the fourth conductive line.

In an embodiment, an elongation rate of the lower connection line may be greater than an elongation rate of the first conductive line and an elongation rate of the second conductive line.

In an embodiment, the display device may further include a third pixel area on which a third pixel is disposed, the third pixel area being disposed adjacent to the first pixel area along a second direction intersecting the first direction and an upper connection line disposed on the inorganic insulating layer and the organic insulating layer, connecting the first pixel and the third pixel, and crossing the first pixel area and the third pixel area.

In an embodiment, the groove of the inorganic insulating layer may extend along the first direction. The upper connection line may extend along the second direction.

In an embodiment, the upper connection line may be connected to a data line or a power voltage line.

In an embodiment, a melting point of the lower connection line may be greater than a melting point of the upper connection line.

In order to achieve the object of the present inventive concept described above, a display device may include a substrate, the substrate including a first pixel area and a second pixel area disposed adjacent to the first pixel area along a first direction, a first lower connection line disposed on the substrate and crossing the first pixel area and the second pixel area, a first inorganic insulating layer disposed on the first lower connection line and having a first opening disposed between the first pixel area and the second pixel area, a first conductive line disposed on the first inorganic insulating layer in the first pixel area and being connected to the first lower connection line through a first contact hole formed through the first inorganic insulating layer, a second conductive line disposed on the first inorganic insulating layer in the second pixel area and being connected to the first lower connection line through a second contact hole formed through the first inorganic insulating layer, a second inorganic insulating layer disposed on the first conductive line and the second conductive line, and having a second opening overlapping the first opening in a plan view, and an organic insulating layer filling the first opening of the first inorganic insulating layer and the second opening of the second inorganic insulating layer.

In an embodiment, the display device may further include a second lower connection line disposed on a same layer as the first lower connection line, and crossing the first pixel area and the second pixel area, a third conductive line disposed on the second inorganic insulating layer in the first pixel area and being connected to the second lower connection line through a third contact hole formed through the first inorganic insulating layer and the second inorganic insulating layer, and a fourth conductive line disposed on the second inorganic insulating layer in the second pixel area and being connected to the second lower connection line through a fourth contact hole formed through the first inorganic insulating layer and the second inorganic insulating layer.

In an embodiment, the display device may further include a third pixel area disposed adjacent to the first pixel area along a second direction and an upper connection line disposed on the second inorganic insulating layer and crossing the first pixel area and the third pixel area.

In order to achieve the object of the present inventive concept described above, a display device may include a plurality of pixel areas, a lower connection line crossing the plurality of pixel areas, an inorganic insulating layer disposed on the lower connection line and having a groove disposed between adjacent pixel areas of the plurality of pixel areas, and an organic insulating layer filling the groove of the inorganic insulating layer.

In an embodiment, the organic insulating layer may surround at least a portion of the plurality of the pixel areas in a plan view.

In an embodiment, the organic insulating layer may completely surround each of the plurality of the pixel areas in a plan view.

In an embodiment, the display device may further include an upper connection line disposed on the inorganic insulating layer and the organic insulating layer, crossing the plurality of pixel areas, and intersecting the lower connection line.

In order to achieve the object of the present inventive concept described above, a display device may include a substrate, the substrate including a first pixel area on which a first pixel is disposed and a second pixel area on which a second pixel is disposed, emission areas of the first pixel and the second pixel each being defined by an opening of a pixel defining layer in which an emission layer is disposed between a pixel electrode and an opposite electrode, a lower connection line disposed on the substrate, and crossing the first pixel area and the second pixel area, an inorganic insulating layer disposed on the lower connection line and having a groove disposed between the first pixel area and the second pixel area, and an organic insulating layer disposed between the lower connection line and the pixel defining layer, and filling the groove of the inorganic insulating layer.

In the display device according to the embodiments, the lower connection line electrically connecting the pixels disposed in adjacent pixel areas may be disposed under the organic insulating layer filling the groove of the inorganic insulating layer, so that flexibility of the display device may increase, and the display device robust against external impact may be implemented.

BRIEF DESCRIPTION OF THE DRAWINGS

FIGS. 18 and 19 are plan views illustrating a display device according to embodiments.

DETAILED DESCRIPTION OF THE EMBODIMENTS

Hereinafter, display devices in accordance with embodiments of the present inventive concept will be explained in detail with reference to the accompanying drawings.

Figure 1:
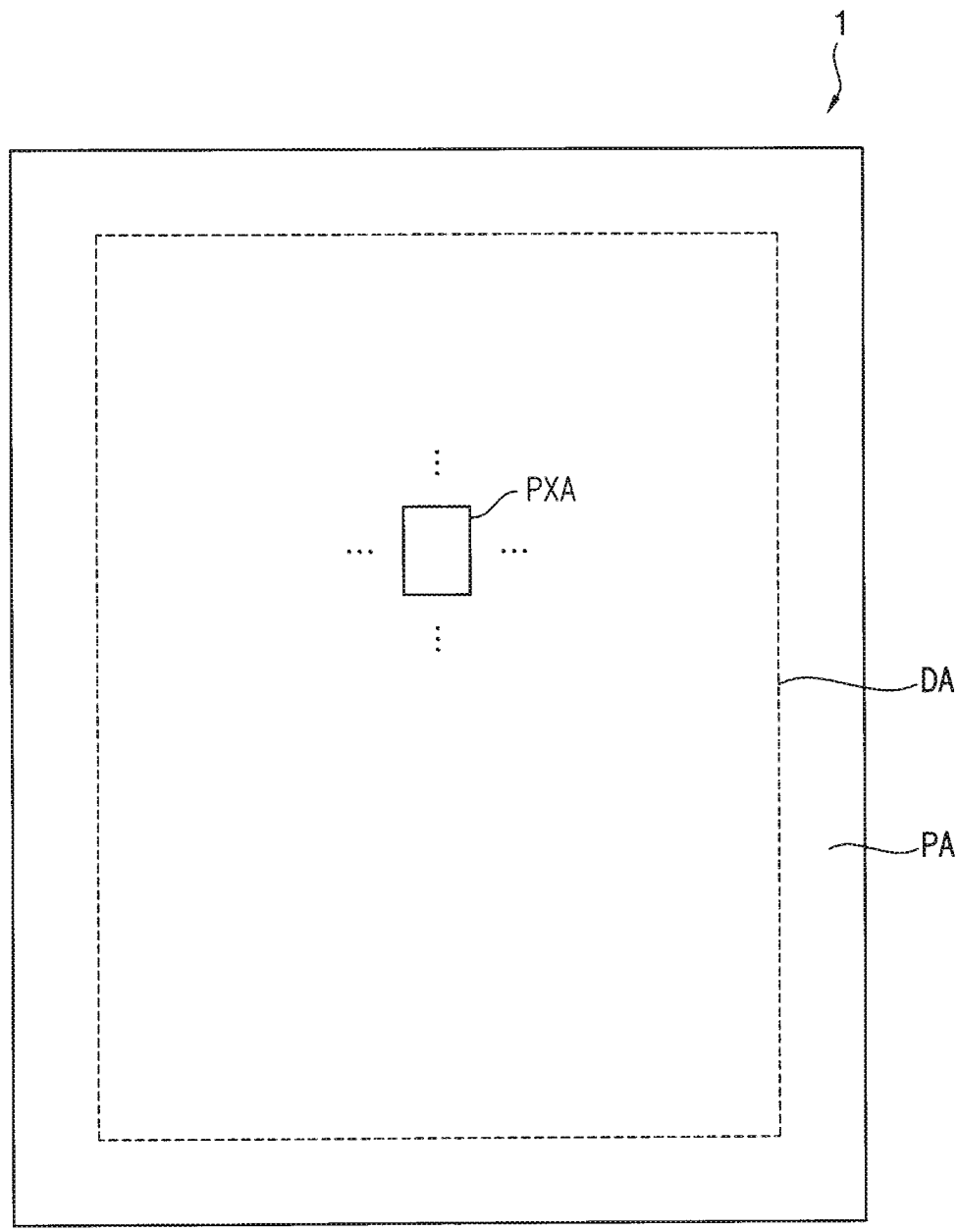
FIG. 1 is a plan view illustrating a display device according to an embodiment.

FIG. 1 is a plan view illustrating a display device according to an embodiment.

Referring to FIG. 1, a display device 1 may include a display area DA and a peripheral area PA outside the display area DA. For example, the peripheral area PA may surround the display area DA. The display area DA may include a plurality of pixel areas PXA in which a plurality of pixels are respectively disposed. Lines that transmit electrical signals applied to the display area DA may be disposed in the peripheral area PA.

Figure 2:
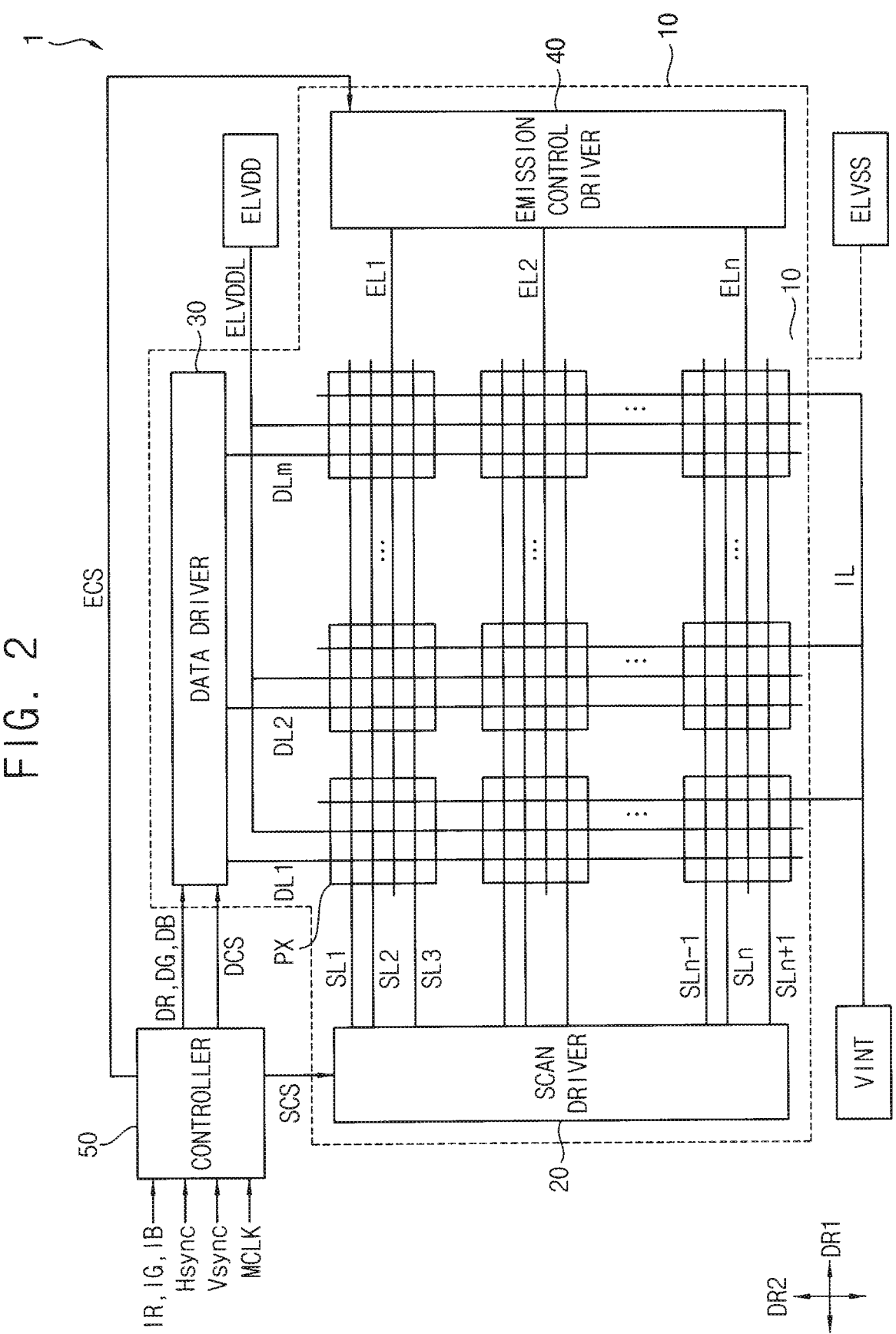
FIG. 2 is a block diagram illustrating the display device in FIG. 1.

FIG. 2 is a block diagram illustrating the display device in FIG. 1.

Referring to FIGS. 1 and 2, the display device 1 may include a display panel 10 including a plurality of pixels PX, a scan driver 20, a data driver 30, and an emission control driver 40, and a controller 50.

The display panel 10 may be disposed in the display area DA, and may include the plurality of pixels PX positioned at intersections of a plurality of scan lines SL1 to SLn+1, a plurality of data lines DL1 to DLm, and a plurality of emission control lines EL1 to ELn. Thus, the plurality of pixels PX may be arranged in a substantial matrix form. The scan lines SL1 to SLn+1 and the emission control lines EL1 to ELn may extend in a first direction DR1 that is a row direction, and the data lines DL1 to DLm and a first power voltage line ELVDDL may extend in a second direction DR2 that is a column direction. Each pixel PX may include a light emitting element such as an organic light emitting diode (OLED), or the like.

Each pixel PX may be connected to three scan lines among the scan lines SL1 to SLn+1. The scan driver 20 may transmit three scan signals to each pixel PX through the scan lines SL1 to SLn+1. In other words, the scan driver 20 may sequentially supply scan signals to scan lines SL2 to SLn, previous scan lines SL1 to SLn−1, and subsequent scan lines SL3 to SLn+1.

Each pixel PX may be connected to one of the data lines DL1 to DLm. The data driver 30 may transmit a data voltage (or a data signal) to each pixel PX through the data lines DL1 to DLm. The data voltage may be supplied to the pixel PX selected by a scan signal when the scan signal is supplied to the scan lines SL2 to SLn.

Each pixel PX may be connected to one of the emission control lines EL1 to ELn. The emission control driver 40 may transmit an emission control signal to each pixel PX through the emission control lines EL1 to ELn. The emission control signal may control the emission time of the pixel PX. The emission control driver 40 may be omitted depending on an internal structure of the pixel PX.

The controller 50 may convert a plurality of image signals IR, IG, and IB transmitted from the outside into a plurality of image data signals DR, DG, and DB, and transmit the converted image data signals DR, DG, and DB to the data driver 30. In addition, the controller 50 may receive a vertical synchronization signal Vsync, a horizontal synchronization signal Hsync, and a clock signal MCLK, and may generate control signals for controlling the scan driver 20, the data driver 30, and the emission control driver 40. In other words, the controller 50 may generate a scan driving control signal SCS for controlling the scan driver 20, a data driving control signal DCS for controlling the data driver 30, and an emission driving control signal ECS for controlling the emission control driver 40.

Each pixel PX may receive a first power voltage ELVDD and a second power voltage ELVSS from external power sources. The first power voltage ELVDD may be a predetermined high level voltage and the second power voltage ELVSS may be a voltage lower than the first power voltage ELVDD or a ground voltage. The first power voltage ELVDD may be supplied to each pixel PX through the first power voltage line ELVDDL. An initialization voltage line IL may receive an initialization voltage VINT from an external power source and supply the initialization voltage VINT to each pixel PX.

Each pixel PX may emit light having a predetermined luminance in response to a driving current supplied to a light emitting element according to the data voltage transmitted through the data lines DL1 to DLm.

Figure 3:
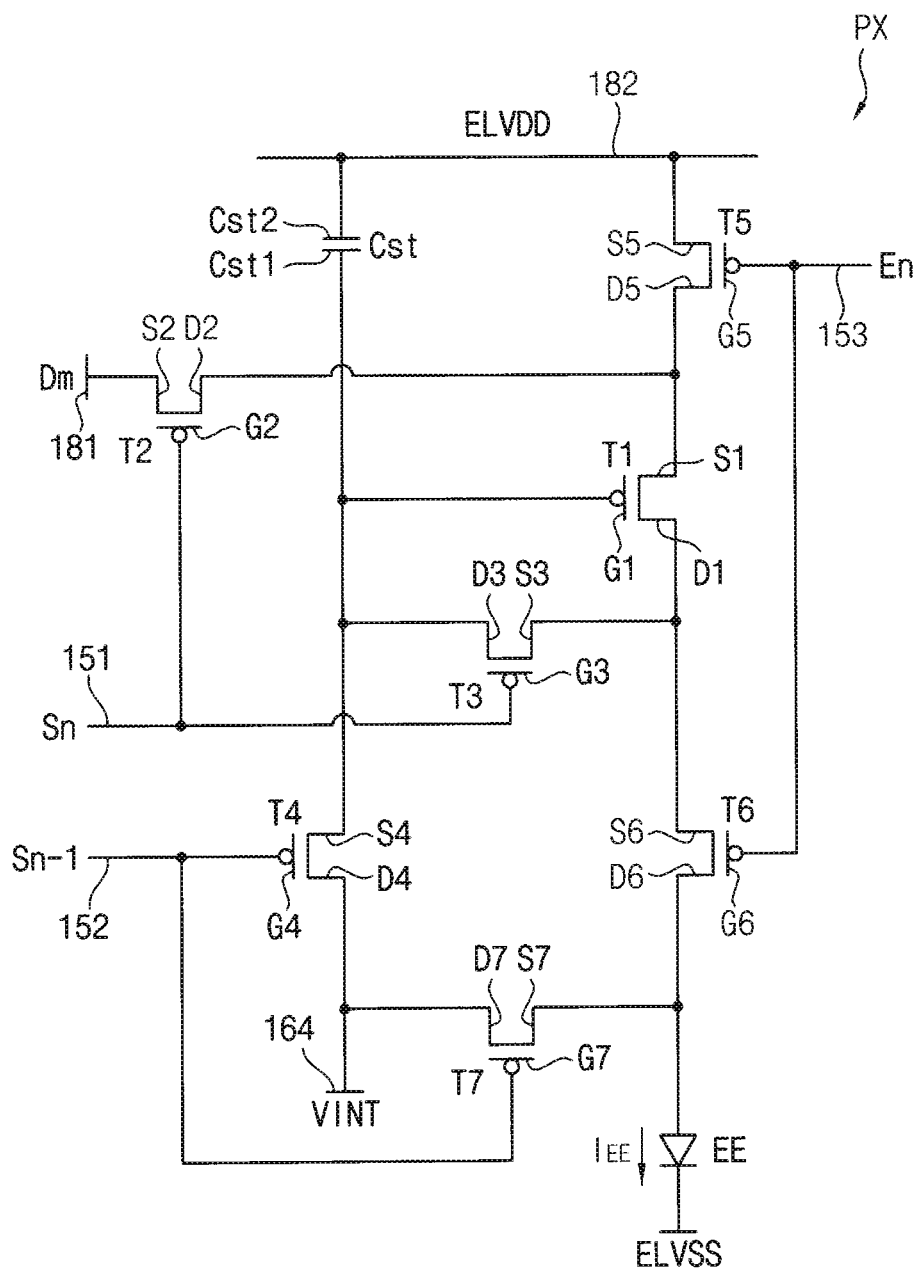
FIG. 3 is a circuit diagram illustrating a pixel included in the display device in FIG. 1.

FIG. 3 is a circuit diagram illustrating the pixel PX included in the display device 1 in FIG. 1.

Referring to FIG. 3, each pixel PX may include signal lines 151, 152, 153, and 181, a plurality of transistors T1, T2, T3, T4, T5, T6, and T7 connected thereto, a storage capacitor Cst, an initialization voltage line 164, a first power voltage line 182, and a light emitting element EE.

FIG. 3 illustrates that the signal lines 151, 152, 153, 181, the initialization voltage line 164, and the first power voltage line 182 are provided for each pixel PX, however, the present inventive concept is not limited thereto. In another embodiment, at least one of the signal lines 151, 152, 153, and 181 and/or the initialization voltage line 164 may be shared by neighboring pixels.

The transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

The signal lines 151, 152, 153, and 181 may include a scan line 151 that transmits a scan signal Sn to the switching transistor T2 and the compensation transistor T3, a previous scan line 152 that transmits a previous scan signal Sn−1 to the first initialization transistor T4 and the second initialization transistor T7, an emission control line 153 that transmits an emission control signal En to the operation control transistor T5 and the emission control transistor T6, and a data line 181 that intersects the scan line 151 and transmits a data voltage Dm. The first power voltage line 182 may transmit a first power voltage ELVDD to the driving transistor T1, and the initialization voltage line 164 may transmit an initialization voltage VINT for initializing the driving transistor T1 and an anode of the light emitting element EE.

A driving gate electrode G1 of the driving transistor T1 may be connected to a first electrode Cst1 of the storage capacitor Cst, a driving source electrode S1 of the driving transistor T1 may be connected to the first power voltage line 182 via the operation control transistor T5, and a driving drain electrode D1 of the driving transistor T1 may be electrically connected to the anode of the light emitting element EE via the emission control transistor T6. The driving transistor T1 may receive the data voltage Dm according to the switching operation of the switching transistor T2 and supply a driving current $I_{EE}$ to the light emitting element EE.

A switching gate electrode G2 of the switching transistor T2 may be connected to the scan line 151, a switching source electrode S2 of the switching transistor T2 may be connected to the data line 181, and a switching drain electrode D2 of the switching transistor T2 may be connected to the driving source electrode S1 of the driving transistor T1 and connected to the first power voltage line 182 via the operation control transistor T5. The switching transistor T2 may perform a switching operation in which the switching transistor T2 is turned on in response to the scan signal Sn transmitted through the scan line 151 and transmits the data voltage Dm transmitted through the data line 181 to the driving source electrode S1 of the driving transistor T1.

A compensation gate electrode G3 of the compensation transistor T3 may be connected to the scan line 151, a compensation source electrode S3 of the compensation transistor T3 may be connected to the driving drain electrode D1 of the driving transistor T1 and connected to the anode of the light emitting element EE via the emission control transistor T6, and a compensation drain electrode D3 of the compensation transistor T3 may be connected to the first electrode Cst1 of the storage capacitor Cst, a first initialization source electrode S4 of the initialization transistor T4, and the driving gate electrode G1 of the driving transistor T1. The compensation transistor T3 may be turned on in response to the scan signal Sn transmitted through the scan line 151 and electrically connect the driving gate electrode G1 and the driving drain electrode D1 of the driving transistor T1 to diode-connect the driving transistor T1.

A first initialization gate electrode G4 of the first initialization transistor T4 may be connected to the previous scan line 152, a first initialization drain electrode D4 of the first initialization transistor T4 may be connected to a second initialization drain electrode D7 of the second initialization transistor T7 and the initialization voltage line 164, and a first initialization source electrode S4 of the first initialization transistor T4 may be connected to the first electrode Cst1 of the storage capacitor Cst, the compensation drain electrode D3 of the compensation transistor T3, and the driving gate electrode G1 of the driving transistor T1. The first initialization transistor T4 may perform an initialization operation in which the first initialization transistor T4 is turned on in response to the previous scan signal Sn−1 transmitted through the previous scan line 152 and transmits the initialization voltage VINT to the driving gate electrode G1 of the driving transistor T1 to initialize the voltage of the driving gate electrode G1 of the driving transistor T1.

An operation control gate electrode G5 of the operation control transistor T5 may be connected to the emission control line 153, an operation control source electrode S5 of the operation control transistor T5 may be connected to the first power voltage line 182, and an operation control drain electrode D5 of the operation control transistor T5 may be connected to the driving source electrode S1 of the driving transistor T1 and the switching drain electrode D2 of the switching transistor T2.

An emission control gate electrode G6 of the emission control transistor T6 may be connected to the emission control line 153, an emission control source electrode S6 of the emission control transistor T6 may be connected to the driving drain electrode D1 of the driving transistor T1 and the compensation source electrode S3 of the compensation transistor T3, and an emission control drain electrode D6 of the emission control transistor T6 may be connected to a second initialization source electrode S7 of the second initialization transistor T7 and the anode of the light emitting element EE.

The operation control transistor T5 and the emission control transistor T6 may be simultaneously turned on in response to the emission control signal En transmitted through the emission control line 153, and thus, the first power voltage ELVDD may be transmitted to the light emitting element EE so that the driving current $I_{EE}$ may flow through the light emitting element EE.

A second initialization gate electrode G7 of the second initialization transistor T7 may be connected to the previous scan line 152, a second initialization source electrode S7 of the second initialization transistor T7 may be connected to the emission control drain electrode D6 of the emission control transistor T6 and the anode of the light emitting element EE, and a second initialization drain electrode D7 of the second initialization transistor T7 may be connected to the first initialization drain electrode D4 of the first initialization transistor T4 and the initialization voltage line 164. The second initialization transistor T7 may be turned on in response to the previous scan signal Sn−1 transmitted through the previous scan line 152 to initialize the anode of the light emitting element EE.

FIG. 3 illustrates that the first initialization transistor T4 and the second initialization transistor T7 are connected to the previous scan line 122, however, the present inventive concept is not limited thereto. In another embodiment, the first initialization transistor T4 may be connected to the previous scan line 122 and driven in response to the previous scan signal Sn−1, and the second initialization transistor T7 may be connected to a separate signal line (e.g., the subsequent scan line) and driven in response to a signal transmitted through the separate signal line. Positions of the source electrodes S1 to S7 and the drain electrodes D1 to D7 in FIG. 3 may be changed according to the type of transistor (p-type or n-type).

A specific operation of each pixel PX according to an embodiment is as follows.

During an initialization period, when the previous scan signal Sn−1 is supplied through the previous scan line 152, the initialization transistor T4 may be turned on in response to the previous scan signal Sn−1, and the driving gate electrode G1 of the driving transistor T1 may be initialized by the initialization voltage VINT supplied from the initialization voltage line 164.

During a data programming period, when the scan signal Sn is supplied through the scan line 151, the switching transistor T2 and the compensation transistor T3 may be turned on in response to the scan signal Sn. In this case, the driving transistor T1 may be diode-connected by the turned-on compensation transistor T3 and biased in the forward direction.

Then, a compensation voltage (Dm+Vth, Vth is a negative value) reduced by a threshold voltage Vth of the driving transistor T1 from the data voltage Dm supplied from the data line 181 may be applied to the driving gate electrode G1 of the driving transistor T1. In this case, the first power voltage ELVDD and the compensation voltage Dm+Vth may be applied to opposite electrodes Cst1 and Cst2 of the storage capacitor Cst, and electric charges corresponding to the voltage difference between the opposite electrodes Cst1 and Cst2 may be stored in the storage capacitor Cst.

During an emission period, the operation control transistor T5 and the emission control transistor T6 may be turned on by the emission control signal En supplied from the emission control line 153. The driving current $I_{EE}$ may be generated according to the voltage difference between the voltage of the gate electrode G1 of the driving transistor T1 and the first power voltage ELVDD, and the driving current $I_{EE}$ may be supplied to the light emitting element EE through the emission control transistor T6.

Figure 4:
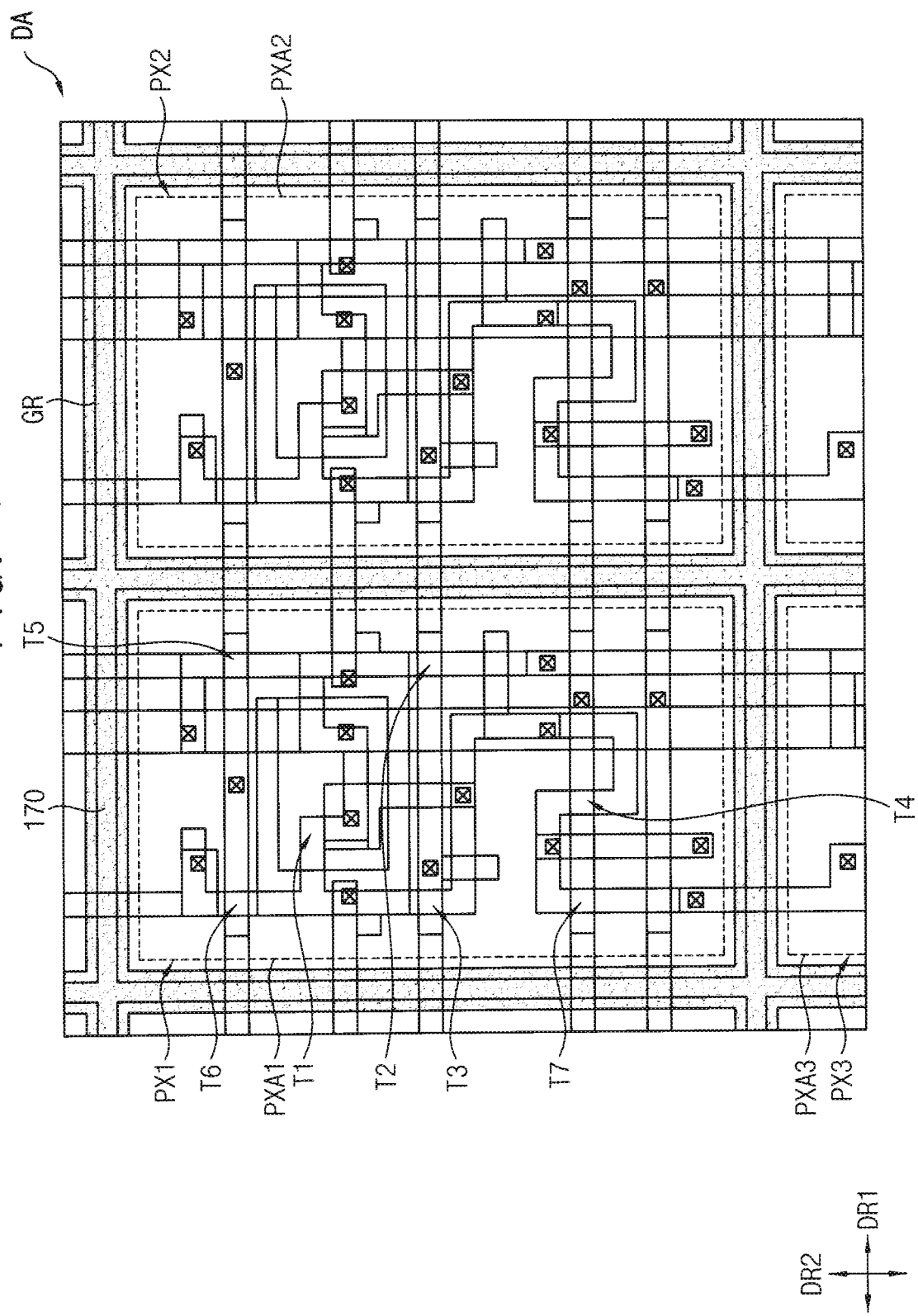
FIG. 4 is a layout view illustrating adjacent pixels included in the display device in FIG. 1.

FIG. 4 is a layout view illustrating adjacent pixels included in the display device 1 in FIG. 1.

Referring to FIG. 4, the display area DA of the display device 1 may include a plurality of pixel areas PXA1, PXA2, and PXA3 on which the plurality of pixels PX1, PX2, and PX3 are respectively disposed. The pixel areas PXA1, PXA2, and PXA3 may be arranged as a substantial matrix form along the first direction DR1 and the second direction DR2. The pixel areas PXA1, PXA2, and PXA3 may include a first pixel area PXA1 on which a first pixel PX1 is disposed, a second pixel area PXA2 disposed in the first direction DR1 from the first pixel area PXA1 and on which a second pixel PX2 is disposed, and a third pixel area PXA3 disposed in the second direction DR2 from the first pixel area PXA1 and on which a third pixel PX3 is disposed. The transistors T1 to T7 may be disposed in each of the pixel areas PXA1, PXA2, and PXA3.

Figure 10:
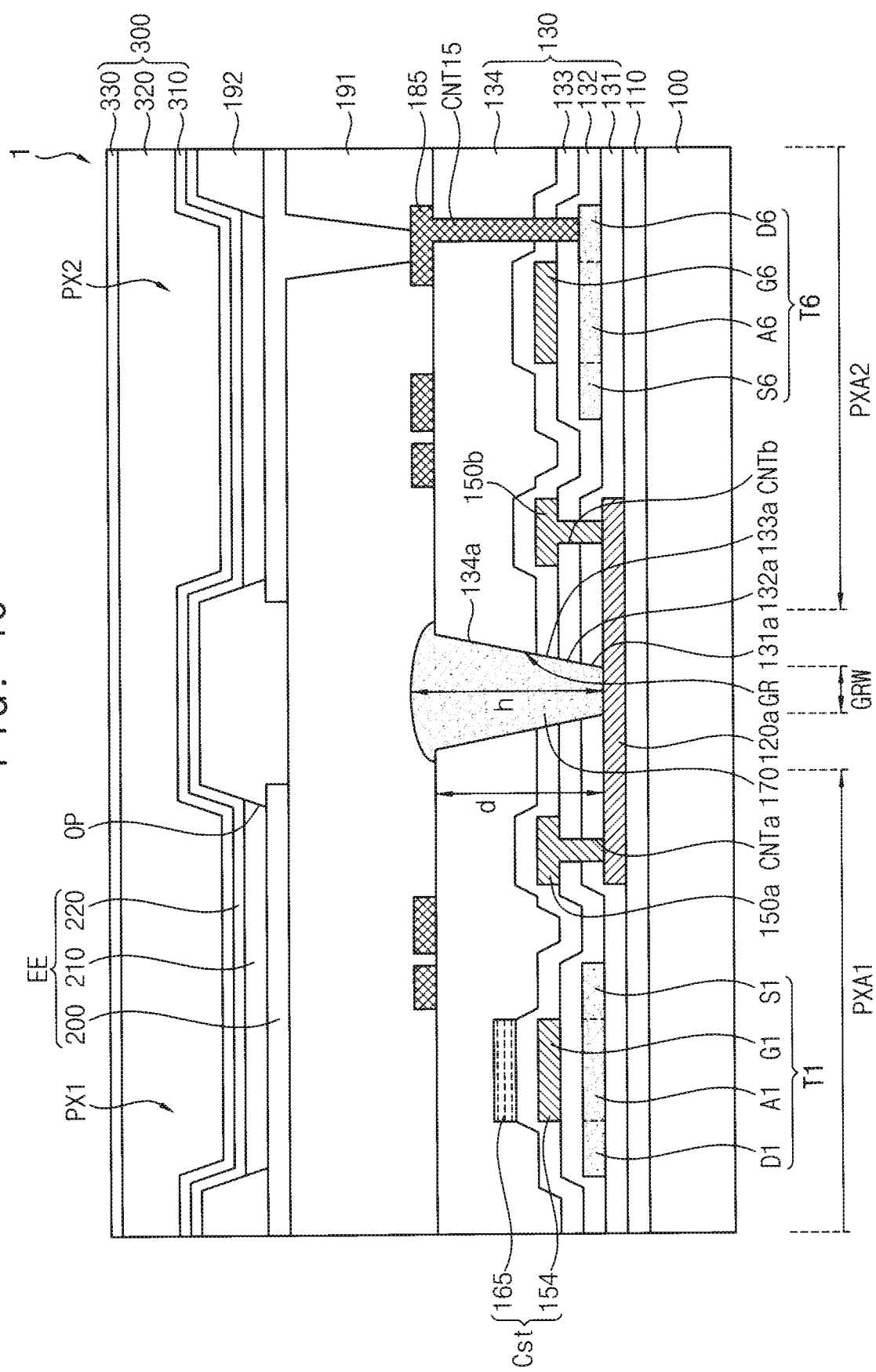
FIG. 10 is a cross-sectional view illustrating a portion between a first pixel area and a second pixel area in FIG. 4.
Figure 11:
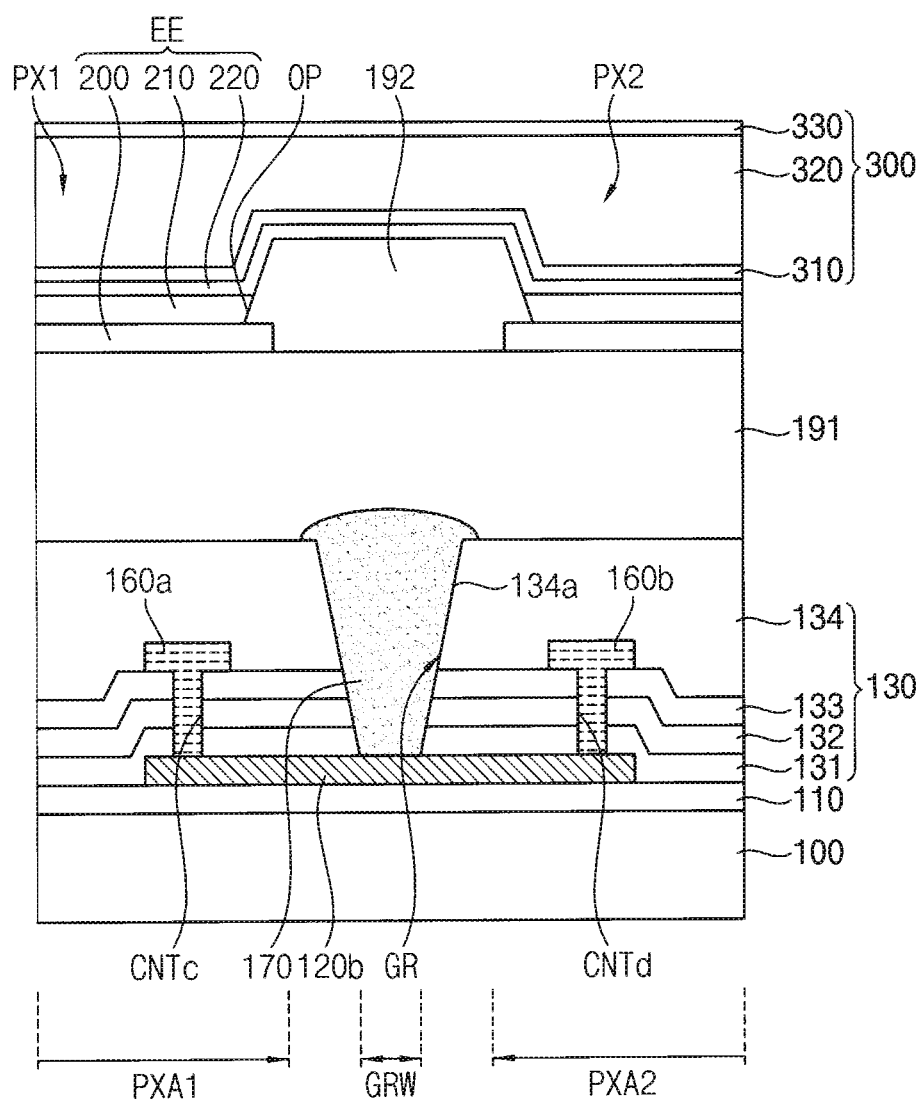
FIG. 11 is a cross-sectional view illustrating another portion between a first pixel area and a second pixel area in FIG. 4.
Figure 12:
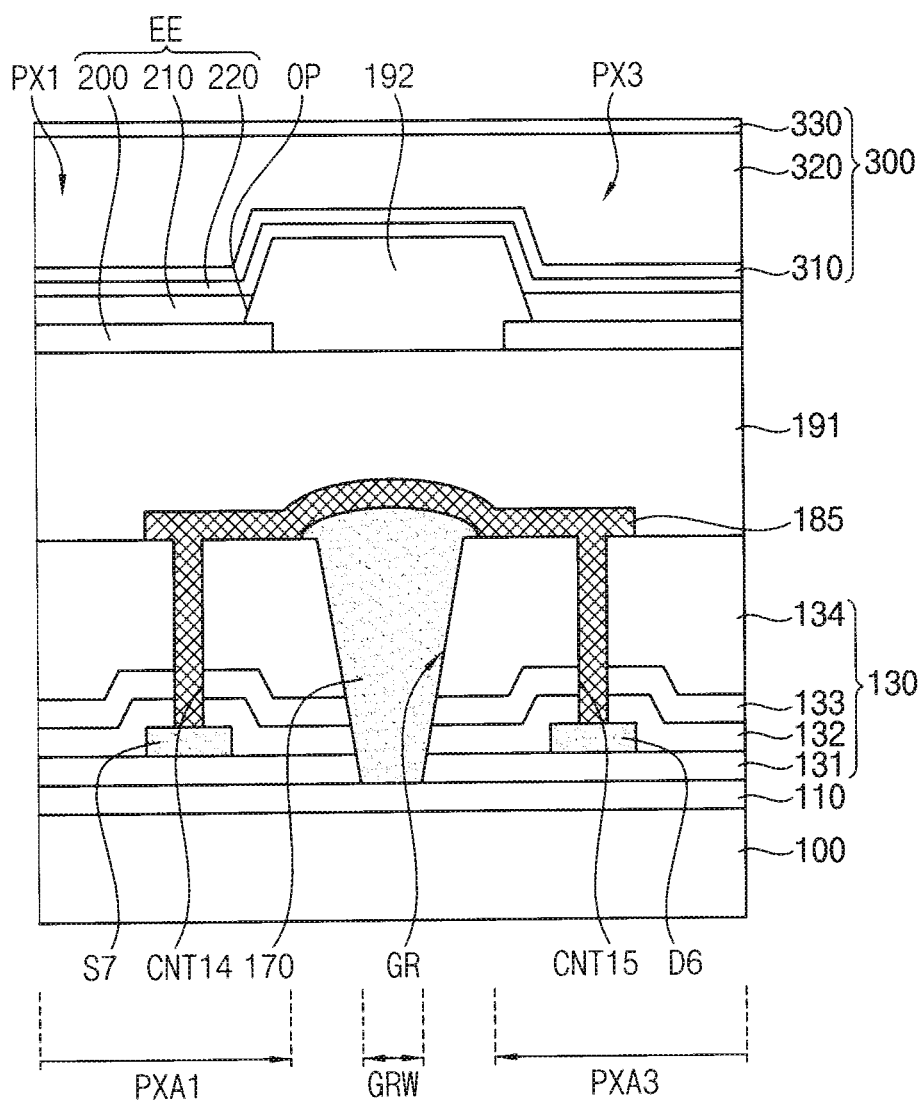
FIG. 12 is a cross-sectional view illustrating a portion between a first pixel area and a third pixel area in FIG. 4.

FIGS. 5, 6, 7, 8, and 9 are layout views illustrating elements in FIG. 4 for each layer. FIG. 10 is a cross-sectional view illustrating a portion between the first pixel area PXA1 and the second pixel area PXA2 in FIG. 4. FIG. 11 is a cross-sectional view illustrating another portion between the first pixel area PXA1 and the second pixel area PXA2 in FIG. 4. FIG. 12 is a cross-sectional view illustrating a portion between the first pixel area PXA1 and the third pixel area PXA3 in FIG. 4.

Referring to FIGS. 4 to 12, a display device 1 may include a substrate 100, a lower connection line 120 disposed on the substrate 100, an inorganic insulating layer 130 disposed on the lower connection line 120 and having a groove GR disposed between the pixel areas PXA1, PXA2, and PXA3 and exposing at least a portion of the lower connection line 120, an organic insulating layer 170 at least filling the groove GR of the inorganic insulating layer 130, and an upper connection line 180 disposed on the inorganic insulating layer 130 and the organic insulating layer 170.

The substrate 100 may include glass, metal, or plastic. In an embodiment, the substrate 100 may include a material having a flexible or bendable characteristic. When the substrate 100 has the flexible or bendable characteristic, the substrate 100 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 may have a single layer structure or a multilayer structure of the above materials, and may further include an inorganic layer in the case of the multilayer structure. In an embodiment, the substrate 100 may have an organic/inorganic/organic structure.

A bather layer 110 may be disposed on the substrate 100. The bather layer 110 may prevent or minimize impurities from the substrate 100 from penetrating upward. The bather layer 110 may include an inorganic material such as silicon oxide, silicon nitride, silicon oxynitride, or the like, and may have a single layer or multilayer structure.

The lower connection line (or a first conductive layer) 120 may be disposed on the bather layer 110. The lower connection line 120 may connect the pixels arranged in the first direction DR1. For example, the lower connection line 120 may connect the first pixel PX1 and the second pixel PX2 disposed adjacent to each other along the first direction DR1. The lower connection line 120 may function as a line that transmits an electrical signal to the pixels arranged in the first direction DR1. Since the lower connection line 120 connects the pixels disposed adjacent to each other along the first direction DR1, the lower connection line 120 may extend relatively long. Accordingly, stress may be applied to the lower connection line 120.

The lower connection line 120 may include a material having a high elongation rate. Accordingly, defects in the lower connection line 120 such as cracks in the lower connection line 120 or disconnection of the lower connection line 120 may not occur. In an embodiment, an elongation rate of the lower connection line 120 may be greater than elongation rates of conductive layers disposed inside the inorganic insulating layer 130, for example, the second conductive layer 150 and the third conductive layer 160 which will be described hereinunder.

In an embodiment, after the lower connection line 120 is formed on the substrate 100, a semiconductor layer 140 may be formed on the lower connection line 120. Further, a high temperature process for forming the semiconductor layer 140 which includes a thermal treatment may be performed before forming the upper connection line 180. Accordingly, the lower connection line 120 may be exposed to the high temperature process for forming the semiconductor layer 140.

The lower connection line 120 may include a material having a high melting point. Accordingly, damage of the lower connection line 120 by the high temperature process may be prevented. For example, the lower connection line 120 may include a metal having a relatively high melting point, such as molybdenum (Mo), titanium (Ti), or the like. The lower connection line 120 may have a multi-layered structure. For example, the lower connection line 120 may have a multi-layered structure of Ti—TiN. In an embodiment, a melting point of the lower connection line 120 may be greater than a melting point of the upper connection line 180.

The lower connection line 120 may include a scan connection line 121, a previous scan connection line 122, an emission control connection line 123, an initialization voltage connection line 124, and a mesh connection line 125. The scan connection line 121, the previous scan connection line 122, the emission control connection line 123, the initialization voltage connection line 124, and the mesh connection line 125 may be formed at the same time using the same process and include the same material.

The scan connection line 121 may connect the scan line 151 of the first pixel PX1 and the scan line 151 of the second pixel PX2. The scan connection line 121 may extend in the first direction DR1 while overlapping the scan line 151 of the first pixel PX1 and the scan line 151 of the second pixel PX2.

The previous scan connection line 122 may connect the previous scan line 152 of the first pixel PX1 and the previous scan line 152 of the pixel PX2. The previous scan connection line 122 may extend in the first direction DR1 while overlapping the previous scan line 152 of the first pixel PX1 and the previous scan line 152 of the second pixel PX2.

The emission control connection line 123 may connect the emission control line 153 of the first pixel PX1 and the emission control line 153 of the second pixel PX2. The emission control connection line 123 may extend in the first direction DR1 while overlapping the emission control line 153 of the first pixel PX1 and the emission control line 153 of the second pixel PX2.

The initialization voltage connection line 124 may connect the initialization voltage line 164 of the first pixel PX1 and the initialization voltage line 164 of the second pixel PX2. The initialization voltage connection line 124 may extend in the first direction DR1 while overlapping the initialization voltage line 164 of the first pixel PX1 and the initialization voltage line 164 of the second pixel PX2.

The mesh connection line 125 may connect the second electrode 165 of the storage capacitor Cst of the first pixel PX1 and the second electrode 165 of the storage capacitor Cst of the second pixel PX2. Since the second electrode 165 of the storage capacitor Cst is connected to the first power voltage line 182 to receive the first power voltage, the mesh connection line 125 may serve to transmit first power voltage across a plurality of pixels arranged in the first direction DR1. A first power voltage line having a mesh structure may be formed by the mesh connection line 125 without securing a space for arranging a separate first power voltage line extending in the first direction DR1. Accordingly, a space for the storage capacitor Cst may be further secured, so that a high-definition display device 1 may be implemented.

The scan connection line 121, the previous scan connection line 122, the emission control connection line 123, the initialization voltage connection line 124, and the mesh connection line 125 may connect the first pixel PX1 and the second pixel PX2, while extending from the first pixel area PXA1 to the second pixel area PXA2. The scan connection line 121, the previous scan connection line 122, the emission control connection line 123, the initialization voltage connection line 124, and the mesh connection line 125 may connect a plurality of pixels arranged in the first direction DR1.

In the present embodiment, conductive layers such as the scan line 151, the previous scan line 152, the emission control line 153, the initialization voltage line 164, and the second electrode 165 of the storage capacitor Cst disposed over the lower connection line 120 may be separately formed for each pixel. Accordingly, it is possible to prevent stress generated in one pixel from propagating to another pixel. The lower connection line 120 may connect a plurality of pixels while crossing the pixels thereby connecting the conductive layers separately formed for each pixel.

An inorganic insulating layer 130 may be disposed on the lower connection line 120. The inorganic insulating layer 130 may include a buffer layer 131, a first inorganic insulating layer 132, a second inorganic insulating layer 133, and a third inorganic insulating layer 134 sequentially disposed on the substrate 100.

The buffer layer 131 may be disposed on the lower connection line 120. The buffer layer 131 may be formed on the bather layer 110 while covering the lower connection line 120. The buffer layer 131 may include an inorganic material such as silicon oxide, silicon nitride, silicon oxynitride, or the like. The buffer layer 131 may serve to increase the smoothness of an upper surface of the substrate 100.

A semiconductor layer 140 may be disposed on the buffer layer 131. The semiconductor layer 140 may be formed of polycrystalline silicon, amorphous silicon, an oxide semiconductor, or the like. The semiconductor layer 140 may be bent into various shapes. The semiconductor layer 140 may include a driving semiconductor portion AS1 of the driving transistor T1, a switching semiconductor portion AS2 of the switching transistor T2, a compensation semiconductor portion AS3 of the compensation transistor T3, a first initialization semiconductor portion AS4 of the first initialization transistor T4, an operation control semiconductor portion AS5 of the operation control transistor T5, an emission control semiconductor portion AS6 of the emission control transistor T6, and a second initialization semiconductor portion AS7 of the second initialization transistor T7.

The semiconductor layer 140 of each of the pixels may be formed to be separated from each other. For example, the semiconductor layer 140 of the first pixel PX1 may be formed to be spaced apart from the semiconductor layer 140 of the second pixel PX2.

Each of the semiconductor portions AS1 to AS7 may include a channel region, and a source region and a drain region disposed on opposite sides of the channel region. In an embodiment, the source region and the drain region may be doped with impurities and the impurities may include N-type impurities or P-type impurities. The source region and the drain region may correspond to a source electrode and a drain electrode, respectively.

The driving semiconductor portion AS1 may include a driving channel region A1, and a driving source region S1 and a driving drain region D1 disposed on opposite sides of the driving channel region A1. The driving semiconductor portion AS1 may have a curved shape, and the driving channel region A1 may be formed to be longer than the other channel regions A2 to A7. For example, when the driving semiconductor portion AS1 has a shape bent a plurality of times to have a shape of 'Ω' or 'S', a long channel length may be formed in a narrow space. Since the driving channel region A1 is formed long, a driving range of a gate voltage applied to the driving gate electrode G1 may be widened, so that the grayscale of light emitted from the light emitting element EE may be more precisely controlled, and the display quality of the display device 1 may be improved.

The switching semiconductor portion AS2 may include a switching channel region A2, and a switching source region S2 and a switching drain region D2 disposed on opposite sides of the switching channel region A2. The switching drain region D2 may be connected to the driving source region S1.

The compensation semiconductor portion AS3 may include compensation channel regions A3a and A3c, and a compensation source region S3 and a compensation drain region D3 disposed on opposite sides of the compensation channel regions A3a and A3c. The compensation transistor T3 is a dual transistor, and the compensation semiconductor portion AS3 may include two compensation channel regions A3a and A3c. A region A3b disposed between the compensation channel regions A3a and A3c may be a region doped with impurities, and may correspond to a source region of one of the dual transistors and a drain region of the other of the dual transistors.

The first initialization semiconductor portion AS4 may include first initialization channel regions A4a and A4c, and a first initialization source region S4 and a first initialization drain region D4 disposed on opposite sides of the first initialization channel regions A4a and A4c. The first initialization transistor T4 is a dual transistor, and the first initialization semiconductor portion AS4 may include two first initialization channel regions A4a and A4c. A region A4b disposed between the first initialization channel regions A4a and A4 may be a region doped with impurities, and may correspond to a source region of one of the dual transistors and a drain region of the other of the dual transistors.

The operation control semiconductor portion AS5 may include an operation control channel region A5, and an operation control source region S5 and an operation control drain region D5 disposed on opposite sides of the operation control channel region A5. The operation control drain region D5 may be connected to the driving source region S1.

The emission control semiconductor portion AS6 may include an emission control channel region A6, and an emission control source region S6 and an emission control drain region D6 disposed on opposite sides of the emission control channel region A6. The emission control source region S6 may be connected to the driving drain region D1.

The second initialization semiconductor portion AS7 may include a second initialization channel region A7, and a second initialization source region S7 and a second initialization drain region D7 disposed on opposite sides of the second initialization channel region A7. The second initialization drain region D7 may be connected to the first initialization drain region D4.

The first inorganic insulating layer 132 may be disposed on the semiconductor layer 140. The first inorganic insulating layer 132 may be formed on the buffer layer 131 while covering the semiconductor layer 140. The first inorganic insulating layer 132 may include an inorganic material such as silicon oxide, silicon nitride, silicon oxynitride, aluminum oxide, titanium oxide, tantalum oxide, hafnium oxide, zinc oxide, or the like.

A second conductive layer 150 may be disposed on the first inorganic insulating layer 132. The second conductive layer 150 may include molybdenum (Mo), copper (Cu), or the like, and may be formed of a single layer or multiple layers.

The second conductive layer 150 may include the scan line 151, the previous scan line 152, the emission control line 153, and the driving gate electrode G1. The scan line 151, the previous scan line 152, the emission control line 153, and the driving gate electrode G1 (154) may include the same material.

The driving gate electrode G1 may be an island type and may overlap the driving channel region A1 of the driving semiconductor portion AS1. The driving gate electrode G1 may perform not only a function as a gate electrode of the driving transistor T1 but also a function as a first electrode 154 of the storage capacitor Cst.

Part or protruding portions of the scan line 151, the previous scan line 152, and the emission control line 153 may correspond to gate electrodes G2 to G7 of the transistors T2 to T7. Regions of the scan line 151 overlapping the switching channel region A2 and the compensation channel regions A3a and A3c may correspond to the switching gate electrode G2 and the compensation gate electrodes G3a and G3b, respectively. Regions of the previous scan lines 152 overlapping the first initialization channel regions A4a and A4c and the second initialization channel region A7 may correspond to the first initialization gate electrodes G4a and G4b and the second initialization gate electrode G7, respectively. Regions of the emission control line 153 overlapping the operation control channel region A5 and the emission control channel region A6 may correspond to the operation control gate electrode G5 and the emission control gate electrode G6, respectively.

In the present embodiment, the scan line 151, the previous scan line 152, the emission control line 153, and the driving gate electrode G1 of each of the pixels may be separated from each other. For example, the scan line 151, the previous scan line 152, the emission control line 153, and the driving gate electrode G1 of the first pixel PX1 may be formed to be spaced apart from the scan lines 151, the previous scan line 152, the emission control line 153, and the driving gate electrode G1 of the second pixel PX2.

The scan line 151, the previous scan line 152, and the emission control line 153 of the first pixel PX1 may be connected to the scan line 151, the previous scan line 152, and the emission control line 153 of the second pixel PX2, respectively, by the lower connection line 120. The scan line 151 of the first pixel PX1 and the scan line 151 of the second pixel PX2 may be connected to the scan connection line 121 through contact holes CNT1a and CNT1b formed through the buffer layer 131 and the first inorganic insulating layer 132, and the previous scan line 152 of the first pixel PX1 and the previous scan line 152 of the second pixel PX2 may be connected to the previous scan connection line 122 through contact holes CNT2a and CNT2b formed through the buffer layer 131 and the first inorganic insulating layer 132. The emission control line 153 of the first pixel PX1 and emission control line 153 of the second pixel PX2 may be connected to the emission control connection line 123 through contact holes CNT3a and CNT3b formed through the buffer layer 131 and the first inorganic insulating layer 132.

As illustrated in FIG. 10, a first conductive line 150a of the first pixel PX1 and a second conductive line 150b of the second pixel PX2, which are disposed on the first inorganic insulating layer 132, may be connected by a first lower connection line 120a. For example, the first conductive line 150a may be any one of the scan line 151, the previous scan line 152, and the emission control line 153 of the first pixel PX1, and the second conductive line 150b may be any one of the scan line 151, the previous scan line 152, and the emission control line 153 of the second pixel PX2, which corresponds to the first conductive line 150a. The first lower connection line 120a may be any one of the scan connection line 121, the previous scan connection line 122, and the emission control connection line 123, which corresponds to the first conductive line 150a and the second conductive line 150b.

The first conductive line 150a may contact the first lower connection line 120a through a first contact hole CNTa formed through the buffer layer 131 and the first inorganic insulating layer 132, and the second conductive line 150b may contact the first lower connection line 120a through a second contact hole CNTb formed through the buffer layer 131 and the first inorganic insulating layer 132. Accordingly, the first lower connection line 120a disposed under the inorganic insulating layer 130 may connect the first conductive line 150a and the second conductive line 150b spaced apart from each other. The first lower connection line 120a connected to the scan line 151 or the previous scan line 152 may transmit the scan signal, and the first lower connection line 120a connected to the emission control line 153 may transmit the emission control signal. An elongation rate of the first lower connection line 120a may be greater than an elongation rate of the first conductive line 150a and an elongation rate of the second conductive line 150b.

A second inorganic insulating layer 133 may be disposed on the second conductive layer 150. The second inorganic insulating layer 133 may be formed on the first inorganic insulating layer 132 while covering the second conductive layer 150. The second inorganic insulating layer 133 may include an inorganic material such as silicon oxide, silicon nitride, silicon oxynitride, aluminum oxide, titanium oxide, tantalum oxide, hafnium oxide, zinc oxide, or the like.

A third conductive layer 160 may be disposed on the second inorganic insulating layer 133. The third conductive layer 160 may include molybdenum (Mo), copper (Cu), or the like, and may be formed of a single layer or multiple layers.

The third conductive layer 160 may include the initialization voltage line 164 and the second electrode 165 of the storage capacitor Cst. The initialization voltage line 164 and the second electrode 165 of the storage capacitor Cst may include the same material.

The initialization voltage line 164 and the second electrode 165 of the storage capacitor Cst of each of the pixels may be formed to be separated from each other. For example, the initialization voltage line 164 and the second electrode 165 of the storage capacitor Cst of the first pixel PX1 and the initialization voltage line 164 and the second electrode 165 of the storage capacitor Cst of the second pixel PX2 may be disposed to be spaced apart from each other.

The initialization voltage line 164 and the second electrode 165 of the storage capacitor Cst of the first pixel PX1 may be connected to the initialization voltage line 164 and the second electrode 165 of the storage capacitor Cst of the second pixel PX2, respectively, by the lower connection line 120. The initialization voltage line 164 of the first pixel PX1 and the initialization voltage line 164 of the second pixel PX2 may be connected to the initialization voltage connection line 124 through contact holes CNT4a and CNT4b formed through the buffer layer 131, the first inorganic insulating layer 132 and the second inorganic insulating layer 133, and the second electrode 165 of the storage capacitor Cst of the first pixel PX1 and the second electrode 165 of the storage capacitor Cst of the second pixel PX2 may be connected to the mesh connection line 125 through contact holes CNT5a, CNT5b, CNT6a, and CNT6b formed through the buffer layer 131, the first inorganic insulating layer 132 and the second inorganic insulating layer 133.

As illustrated in FIG. 11, a third conductive line 160a of the first pixel PX1 and a fourth conductive line 160b of the second pixel PX2, which are disposed on the second inorganic insulating layer 133, may be connected by a second lower connection line 120b. For example, the third conductive line 160a may be any one of the initialization voltage line 164 and the second electrode 165 of the storage capacitor Cst of the first pixel PX1, and the fourth conductive line 160b may be any one of the initialization voltage line 164 and the second electrode 165 of the storage capacitor Cst of the second pixel PX2 which corresponds to the third conductive line 160a. The second lower connection line 120b may be any one of the initialization voltage connection line 124 and the mesh connection line 125 which corresponds to the third conductive line 160a and the fourth conductive line 160b.

The third conductive line 160a may contact the second lower connection line 120b through a third contact hole CNTc formed through the buffer layer 131, the first inorganic insulating layer 132 and the second inorganic insulating layer 133, and the fourth conductive line 160b may contact the second lower connection line 120b through a fourth contact hole CNTd formed through the buffer layer 131, the first inorganic insulating layer 132 and the second inorganic insulating layer 133. Accordingly, the second lower connection line 120b disposed under the inorganic insulating layer 130 may connect the third conductive line 160a and the fourth conductive line 160b spaced apart from each other. The second lower connection line 120b connected to the initialization voltage line 164 may transmit the initialization voltage. An elongation rate of the second lower connection line 120b may be greater than an elongation rate of the third conductive line 160a and an elongation rate of the fourth conductive line 160b.

A third inorganic insulating layer 134 may be disposed on the third conductive layer 160. The third inorganic insulating layer 134 may be formed on the second inorganic insulating layer 133 while covering the third conductive layer 160. The third inorganic insulating layer 134 may include an inorganic material such as silicon oxide, silicon nitride, silicon oxynitride, aluminum oxide, titanium oxide, tantalum oxide, hafnium oxide, zinc oxide, or the like.

The inorganic insulating layer 130 may have a groove GR disposed between adjacent pixel areas PXA1, PXA2, and PXA3. The groove GR may mean a trench formed in the inorganic insulating layer 130. The buffer layer 131, the first inorganic insulating layer 132, the second inorganic insulating layer 133, and the third inorganic insulating layer 134 may have openings 131a, 132a, 133a, and 134a disposed in an area corresponding to the groove GR of the inorganic insulating layer 130 and exposing the first lower connection line 120a. The openings 131a, 132a, 133a, and 134a may overlap each other.

A width GRW of the groove GR of the inorganic insulating layer 130 may be several micrometers (μm). For example, the width GRW of the groove GR of the inorganic insulating layer 130 may be about 5 μm to about 10 μm.

The organic insulating layer 170 may be filled in the groove GR of the inorganic insulating layer 130. Between the pixel areas PXA1, PXA2, and PXA3 where the organic insulating layer 170 is dispose, the lower connection line 120 may be disposed under the organic insulating layer 170 to overlap the organic insulating layer 170 in a plan view. The organic insulating layer 170 may include an organic material such as acrylic, methacrylic, polyester, polyethylene, polypropylene, polyethylene terephthalate, polyethylene naphthalate, polycarbonate, polyimide, polyethylene sulfonate, polyoxymethylene, polyarylate, hexamethyldisiloxane, or the like.

The organic insulating layer 170 may be disposed between the pixel areas PXA1, PXA2, and PXA3 to fill at least a portion of the groove GR of the inorganic insulating layer 130. In an embodiment, the organic insulating layer 170 may completely fill the groove GR of the inorganic insulating layer 130. In order for the organic insulating layer 170 to absorb external impacts, it may be desirable to completely fill the grooves GR.

In an embodiment, the organic insulating layer 170 may be formed to extend to an upper surface of the inorganic insulating layer 130. In such an embodiment, an upper surface of the organic insulating layer 170 may have a convex shape due to the characteristics of the organic insulating layer 170. In other words, a maximum height h of the organic insulating layer 160 may be greater than a depth d of the groove GR.

In an embodiment, an angle between an upper surface of the organic insulating layer 170 and an upper surface of the inorganic insulating layer 130 may be less than about 45 degrees. If the slope of the boundary where the upper surface of the inorganic insulating layer 130 and the upper surface of the organic insulating layer 170 contact is not smooth, a conductive material used in the process of forming the upper connection line 180 by patterning a conductive layer may remain on the boundary without being removed therefrom. In this case, a short circuit between adjacent conductive layers may occur due to the remaining conductive material. Therefore, it may be desirable to form the upper surface of the organic insulating layer 170 to have a gentle slope with respect to the upper surface of the inorganic insulating layer 130.

The groove GR of the inorganic insulating layer 130 and the organic insulating layer 170 may be disposed in at least a portion between the pixel areas PXA1, PXA2, and PXA3. In an embodiment, as illustrated in FIG. 4, the groove GR of the inorganic insulating layer 130 and the organic insulating layer 170 may be disposed to completely surround each of the pixel areas PXA1, PXA2, and PXA3. In other words, the organic insulating layer 170 may be disposed to surround the circumference of the first pixel PX1 and the circumference of the second pixel PX2. For example, the groove GR of the inorganic insulating layer 130 and the organic insulating layer 170 may extend in the second direction DR2 between the first pixel area PXA1 and the second pixel area PXA2, and may extend in the first direction DR1 between the first pixel area PXA1 and the third pixel area PXA3. However, the present inventive concept is not limited thereto. In another embodiment, the groove GR of the inorganic insulating layer 130 and the organic insulating layer 170 may not surround each of the pixel areas PXA1, PXA2, and PXA3, and may be formed to extend in the first direction DR1 of the second direction DR2 between the pixel areas PXA1, PXA2, and PXA3.

The groove GR of the inorganic insulating layer 130 and the organic insulating layer 170 may minimize an influence of the display device 1 due to an external impact. Since the inorganic insulating layer 130 has a higher hardness than that of the organic insulating layer 170, the possibility of cracking the inorganic insulating layer 130 due to external impact may be relatively high. When the inorganic insulating layer 130 is cracked, cracks may also occur in signal lines disposed inside or on the inorganic insulating layer 130, and defects such as disconnection may occur.

However, in the display device 1 according to the present embodiment, the inorganic insulating layer 130 may have the groove GR between the plurality of pixel areas PXA1, PXA2, and PXA3, and the organic insulating layer 170 may fill the groove GR of the inorganic insulating layer 130, so that the probability of crack propagation between the plurality of pixel areas PXA1, PXA2, and PXA3 may decrease although an external impact occurs. In addition, since the organic insulating layer 170 has a hardness lower than that of the inorganic insulating layer 130, the organic insulating layer 170 may absorb a stress caused by external impact, and the concentration of stress on the lower connection line 120 disposed under the organic insulating layer 170 may be effectively reduced.

An upper connection line (or a fourth conductive layer) 180 may be disposed on the inorganic insulating layer 130 and the organic insulating layer 170. The upper connection line 180 may connect pixels arranged in the second direction DR2. For example, the upper connection line 180 may connect the first pixel PX1 and the third pixel PX3. Accordingly, the upper connection line 180 may intersect the lower connection line 120 in a plan view. The upper connection line 180 may function as wirings that transmit electrical signals to the pixels arranged in the second direction DR2. Since the upper connection line 180 may connect the pixels arranged in the second direction DR2, the upper connection line 180 may extend relatively longer compared to other lines. Accordingly, there may be a high possibility that stress is applied to the upper connection line 180.

The upper connection line 180 may include a material having a high elongation rate. For example, the upper connection line 180 may include aluminum (Al). In an embodiment, the upper connection line 180 may have a Ti/Al/Ti multilayer structure. Accordingly, defects such as crack or disconnection may not occur in the upper connection line 180. In an embodiment, an elongation rate of the upper connection line 180 may be greater than elongation rates of lines disposed in the inorganic insulating layer 130, for example, the second conductive layer 150 and the third conductive layer 160.

The upper connection line 180 may include the data line 181, the first power voltage line 182, a first node connection line 183, a second node connection line 184, and an intermediate connection line 185. The data line 181, the first power voltage line 182, the first node connection line 183, the second node connection line 184, and the intermediate connection line 185 may include the same material.

The data line 181 may be connected to the switching source region S2 of the switching transistor T2 via a contact hole CNT7 formed through the first inorganic insulating layer 132, the second inorganic insulating layer 133, and the third inorganic insulating layer 134. The data line 181 may connect a plurality of pixels arranged in the second direction DR2, for example, the first pixel PX1 and the third pixel PX3.

The first power voltage line 182 may be connected to the operation control source region S5 of the operation control transistor T5 via a contact hole CNT8 formed through the first inorganic insulating layer 132, the second inorganic insulating layer 133, and the third inorganic insulating layer 134. Further, the first power voltage line 182 may be connected to the second electrode 165 of the storage capacitor Cst via a contact hole CNT9 formed through the third inorganic insulating layer 134. The first power voltage line 182 may connect a plurality of pixels arranged in the second direction DR2, for example, the first pixel PX1 and the third pixel PX3.

The first node connection line 183 may transmit the initialization voltage for initializing the driving transistor T1 and a pixel electrode 200. The first node connection line 183 may be connected to the first and second initialization transistors T4 and T7 via a contact hole CNT10 formed through the first inorganic insulating layer 132, the second inorganic insulating layer 133 and the third inorganic insulating layer 134, and may be connected to the initialization voltage line 164 via a contact hole CNT11 formed through the third inorganic insulating layer 134.

The second node connection line 184 may be connected to the compensation drain region D3 of the compensation transistor T3 via a contact hole CNT12 formed through the first inorganic insulating layer 132, the second inorganic insulating layer 133 and the third inorganic insulating layer 134, and may be connected to the driving gate electrode G1 via a contact hole CNT13 formed through the second inorganic insulating layer 133 and the third inorganic insulating layer 134. The island-type driving gate electrode G1 may be electrically connected to the compensation transistor T3 by the second node connection line 184.

The intermediate connection line 185 may be connected to the second initialization source region S7 of the second initialization transistor T7 via a contact hole CNT14 formed through the first inorganic insulating layer 132, the second inorganic insulating layer 133 and the third inorganic insulating layer 134, and may be connected to the emission control drain region D6 of the emission control transistor T6 via a contact hole CNT15 formed through the first inorganic insulating layer 132, the second inorganic insulating layer 133 and the third inorganic insulating layer 134. As illustrated in FIG. 12, a first end of the intermediate connection line 185 may be connected to the second initialization source region S7 of the second initialization transistor T7 of the first pixel PX1 via the contact hole CNT14, and a second end of the intermediate connection line 185 may be connected to the emission control drain region D6 of the emission control transistor T6 of the third pixel PX3 via the contact hole CNT15.

The data line 181, the first power voltage line 182, and the intermediate connection line 185 may connect the first pixel PX1 and the third pixel PX3 while crossing the first pixel area PXA1 and the third pixel area PXA3. In other words, the data line 181, the first power voltage line 182, and the intermediate connection line 185 may connect a plurality of pixels arranged in the second direction DR2.

A planarization layer 191 may be disposed on the upper connection line 180. The planarization layer 191 may be formed on the third inorganic insulating layer 134 while covering the upper connection line 180. The planarization layer 191 may include an organic material such as acrylic, benzocyclobutene (BCB), polyimide (PI), hexamethyldisiloxane (HMSO), or the like. The planarization layer 191 may be provided as a single layer or multiple layers. The planarization layer 191 may serve to generally planarize upper portions of the transistors T1 to T7.

The light emitting element EE including a pixel electrode 200, an opposite electrode 220, and an intermediate layer 210 interposed therebetween and including an emission layer may be disposed on the planarization layer 191.

The pixel electrode 200 may be connected to the intermediate connection line 185 through a contact hole defined in the planarization layer 191. The pixel electrode 200 may be electrically connected to the emission control drain region D6 of the emission control transistor T6 via the intermediate connection line 185.

A pixel defining layer 192 may be disposed on the planarization layer 191. The pixel defining layer 192 may serve to define a emission area by having an opening OP corresponding to each pixel, that is, an opening OP exposing at least a central portion of the pixel electrode 200. The emission layer included in the intermediate layer 210 may be disposed in the opening OP of the pixel defining layer 192 between the pixel electrode 200 and the opposite electrode 220, and each of the pixels, for example, emission area of the first to third pixels PX1, PX2, and PX3, may be defined by the opening OP of pixel defining layer 192. In addition, the pixel defining layer 192 may increase a distance between an edge of the pixel electrode 200 and the opposite electrode 220 disposed above the pixel electrode 200, so that generating an arc at the edge of the pixel electrode 200 may be prevented. The pixel defining layer 192 may be formed of an organic material such as polyimide or hexamethyldisiloxane (HMDSO).

The intermediate layer 210 may include a low molecular weight material or a high molecular weight material. When the intermediate layer 210 includes the low molecular weight material, the intermediate layer 210 may have a structure in which a hole injection layer (HIL), a hole transport layer (HTL), an emission layer (EML), an electron transport layer (ETL), electron injection layer (EIL), etc. are stacked in a single or complex structure, and may include copper phthalocyanine (CuPc), N,N-di(naphthalen-1-yl)-N, N'-Diphenyl-benzidine (N,N'-Di(naphthalene-1-yl)-N,N'-diphenyl-benzidine: NPB), tris-8-hydroxyquinoline aluminum (tris-8-hydroxyquinoline aluminum) (Alq3), or the like.

When the intermediate layer 210 includes the high molecular weight material, the intermediate layer 210 may have a structure including a hole transport layer (HTL) and an emission layer (EML). In this case, the HTL may include PEDOT, and the EML may include a high molecular weight material such as poly-phenylenevinylene (PPV) and polyfluorene. The intermediate layer 210 may include a layer integrally formed over the plurality of pixel electrodes 200, or may include a layer patterned to correspond to each of the plurality of pixel electrodes 200.

The opposite electrode 220 may be disposed to cover the display area DA. In other words, the opposite electrode 220 may be integrally formed over the plurality of light emitting elements EE to correspond to the plurality of pixel electrodes 200.

In an embodiment, the pixel electrode 200 and the opposite electrode 220 may be an anode and a cathode of the light emitting element EE, respectively. However, present inventive concept is not limited thereto, and in another embodiment, the pixel electrode 200 and the opposite electrode 220 may be a cathode and an anode of the light emitting element EE, respectively.

Since the light emitting element EE may be easily damaged by moisture or oxygen from the outside, an encapsulation layer 300 may cover and protect the light emitting element EE. The encapsulation layer 300 may cover the display area DA and extend outside the display area DA. The encapsulation layer 300 may include a first inorganic encapsulation layer 310, an organic encapsulation layer 320, and a second inorganic encapsulation layer 330.

The first inorganic encapsulation layer 310 may cover the opposite electrode 220 and may include ceramic, metal oxide, metal nitride, metal carbide, metal oxynitride, indium oxide, tin oxide, indium tin oxide (ITO), silicon oxide, silicon nitride and/or silicon oxynitride. If necessary, other layers such as a capping layer may be interposed between the first inorganic encapsulation layer 310 and the opposite electrode 220. Since the first inorganic encapsulation layer 310 is a conformal layer which is formed along the lower structure, an upper surface of the first inorganic encapsulation layer 310 may not be planarized.

The organic encapsulation layer 320 may cover the first inorganic encapsulation layer 310, and unlike the first inorganic encapsulation layer 310, an upper surface of the organic encapsulation layer 320 may be substantially planarized. Specifically, an upper surface of the organic encapsulation layer 320 may be substantially planarized in a portion corresponding to the display area DA. The organic encapsulation layer 320 may include one or more materials selected from the group of acrylic, methacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane.

The second inorganic encapsulation layer 330 may cover the organic encapsulation layer 320, and may include ceramic, metal oxide, metal nitride, metal carbide, metal oxynitride, indium oxide, tin oxide, indium tin oxide (ITO), silicon oxide, silicon nitride and/or silicon oxynitride.

As described above, since the encapsulation layer 300 has a multilayer structure including the first inorganic encapsulation layer 310, the organic encapsulation layer 320, and the second inorganic encapsulation layer 330, although a crack occurs inside the encapsulation layer 300, the crack may not be connected between the first inorganic encapsulation layer 310 and the organic encapsulation layer 320 or between the organic encapsulation layer 320 and the second inorganic encapsulation layer 330. Accordingly, it is possible to prevent or minimize a path through which moisture or oxygen from the outside penetrates into the display area DA.

FIGS. 13, 14, 15, 16, and 17 are cross-sectional views illustrating a method of manufacturing a display device according to an embodiment. FIGS. 13, 14, 15, 16, and 17 may illustrate a method of manufacturing the display device 1 in FIG. 10.

Figure 5:
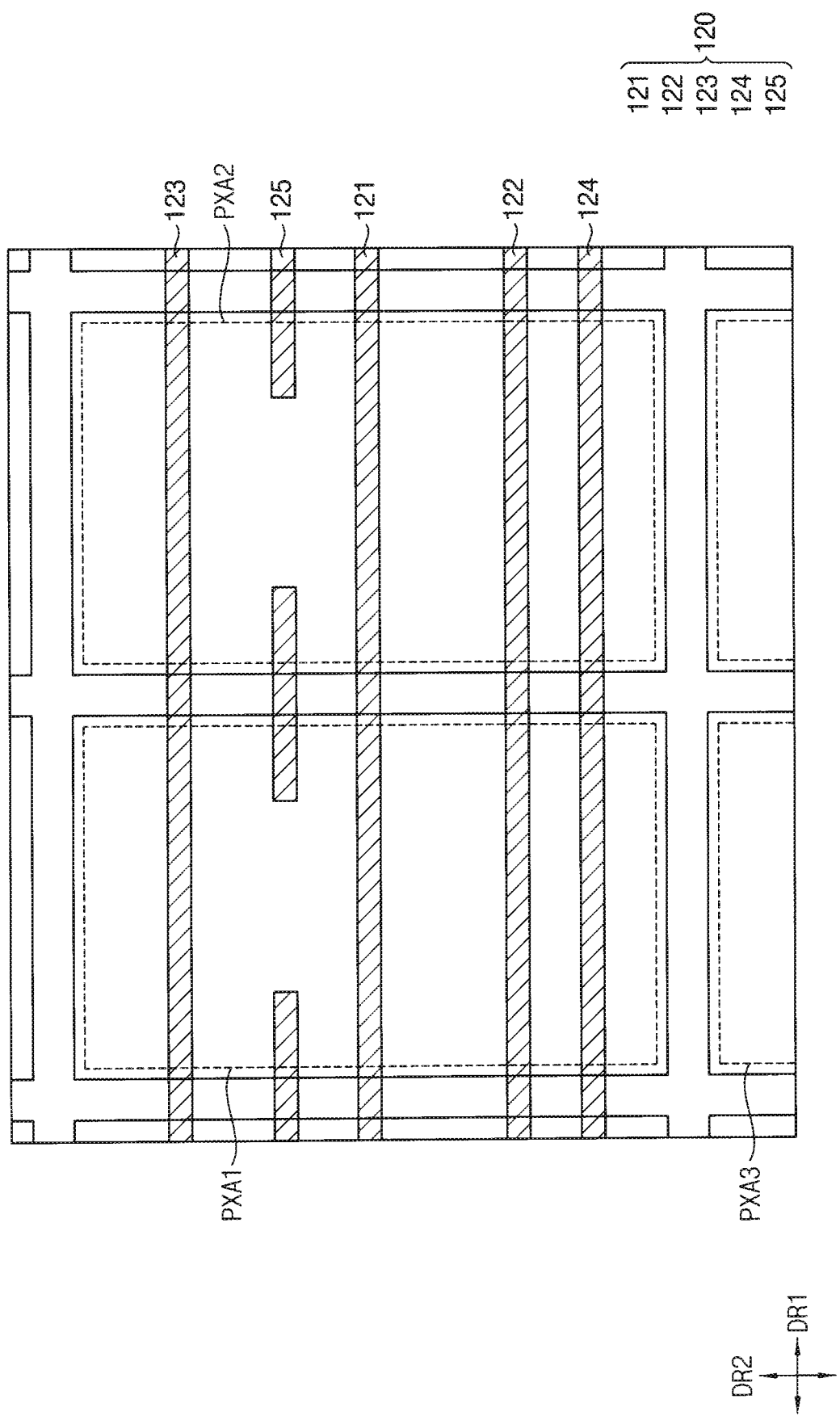
FIGS. 5, 6, 7, 8, and 9 are layout views illustrating elements in FIG. 4 for each layer.
Figure 6:
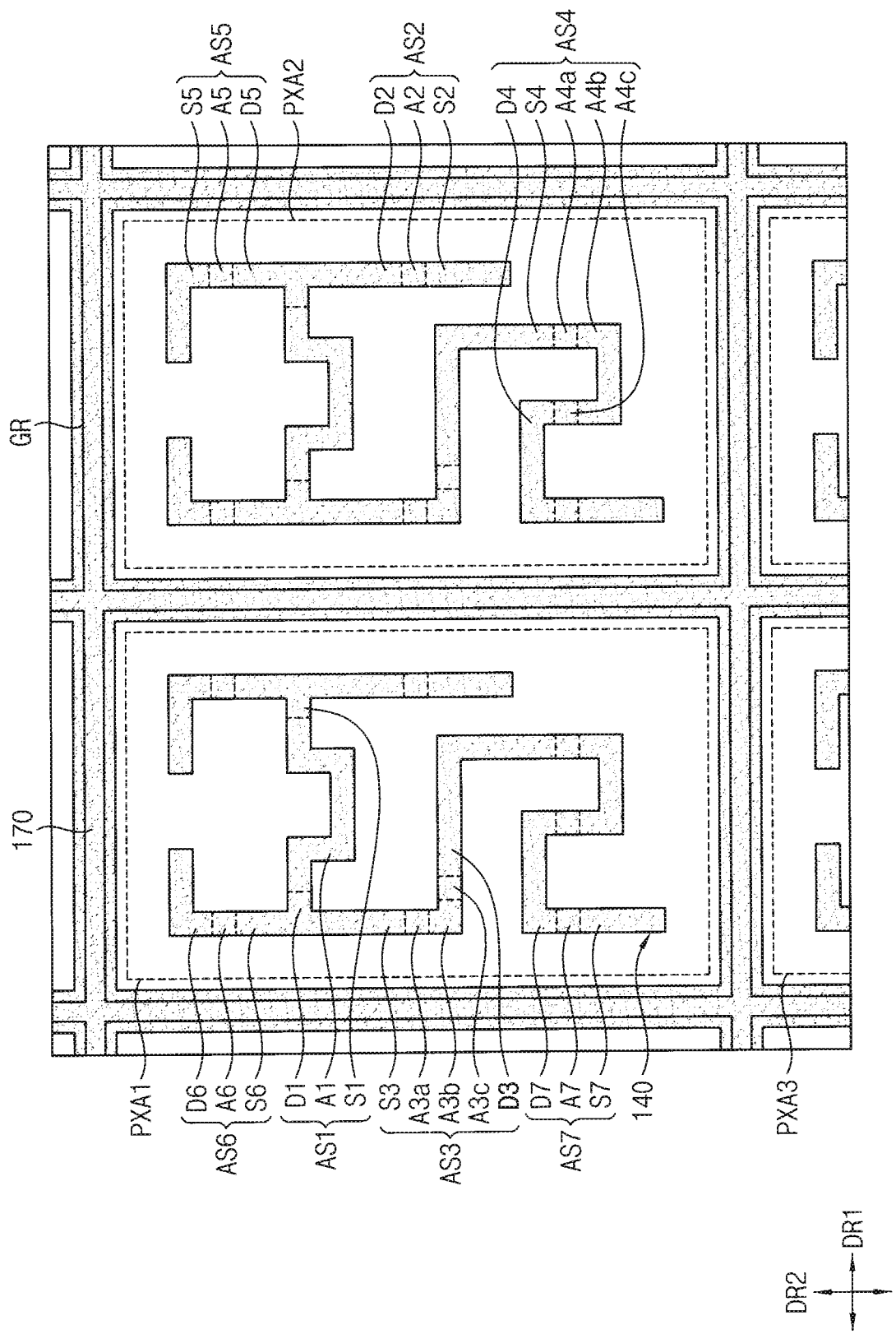
Figure 7:
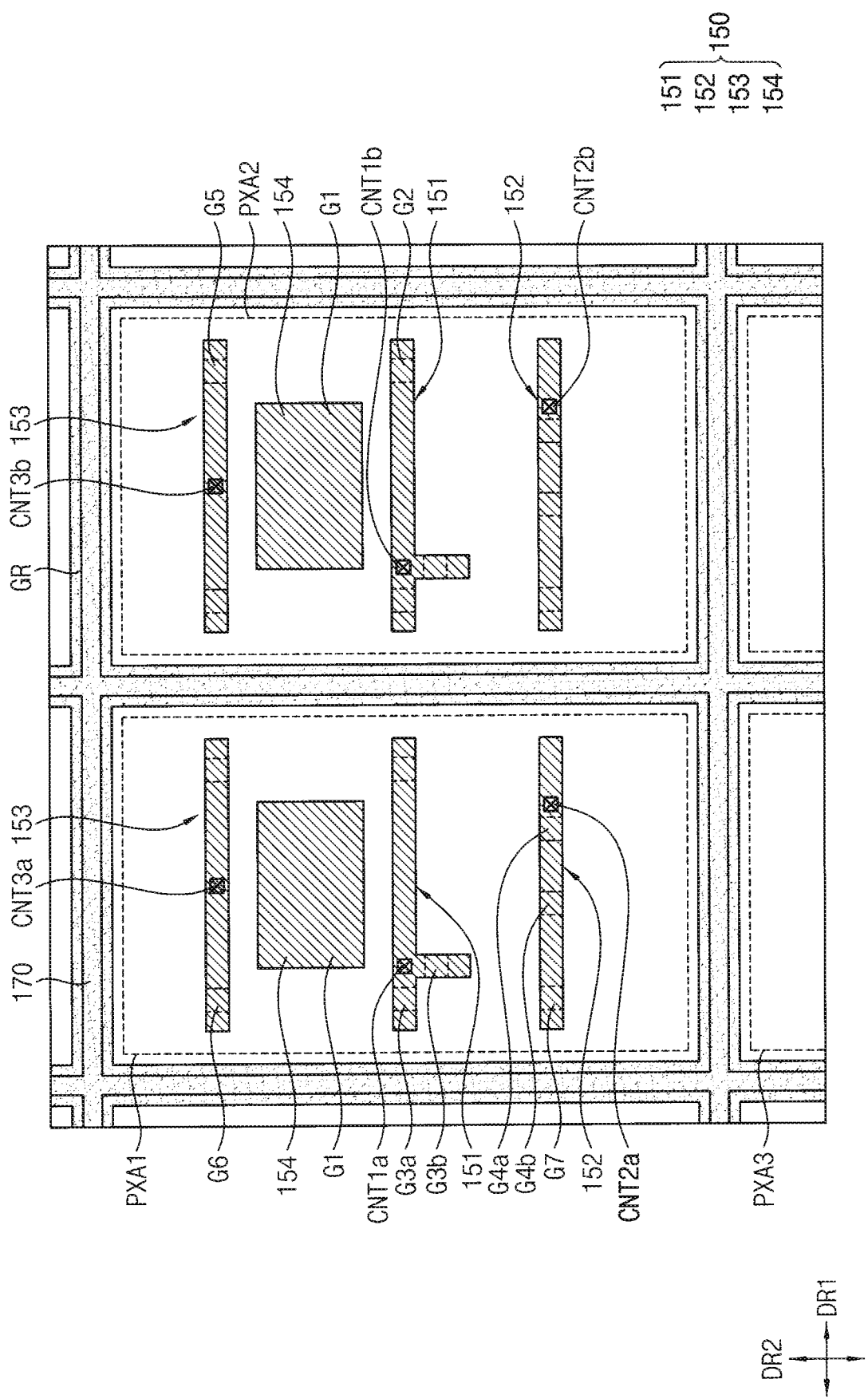
Figure 8:
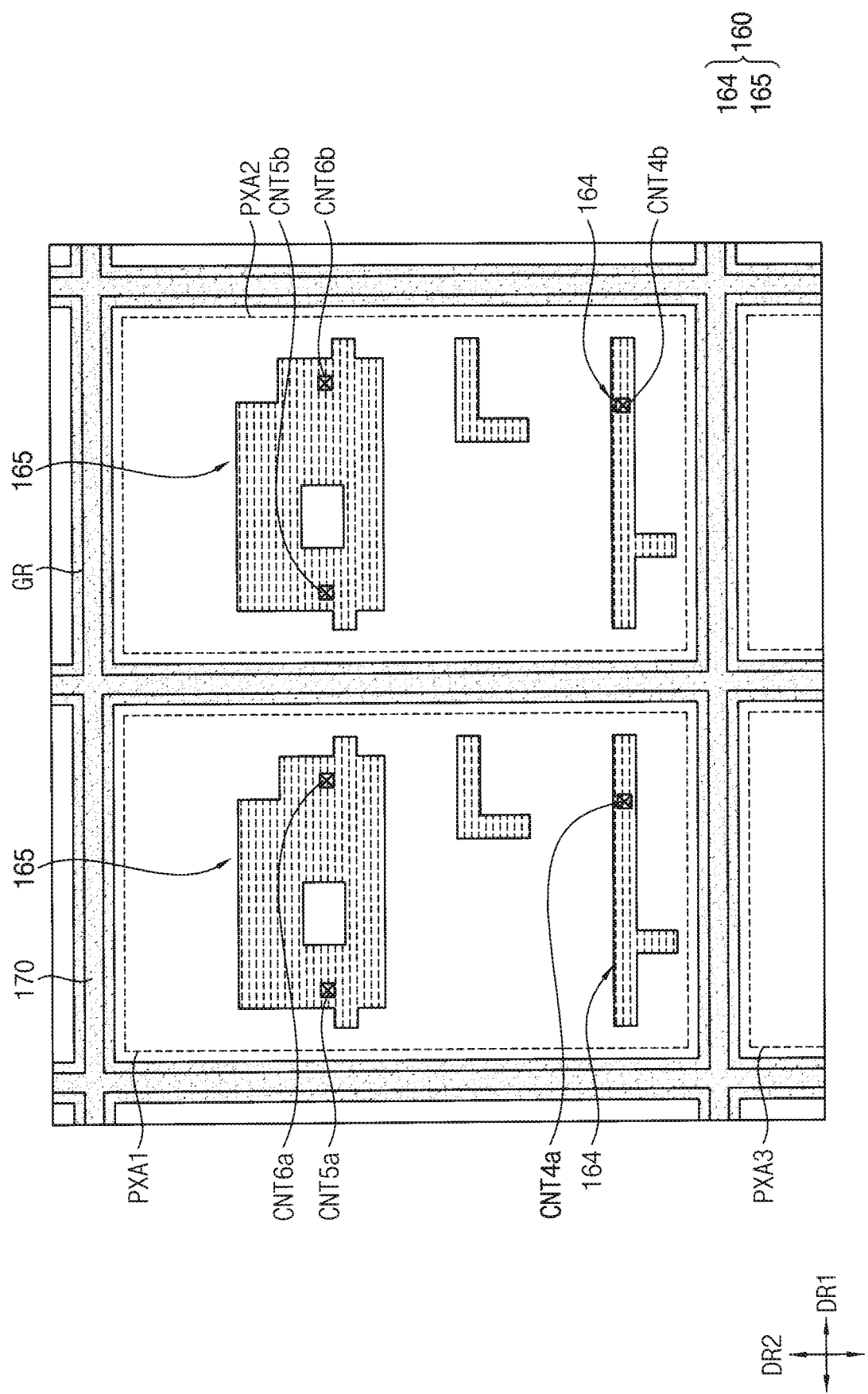
Figure 13:
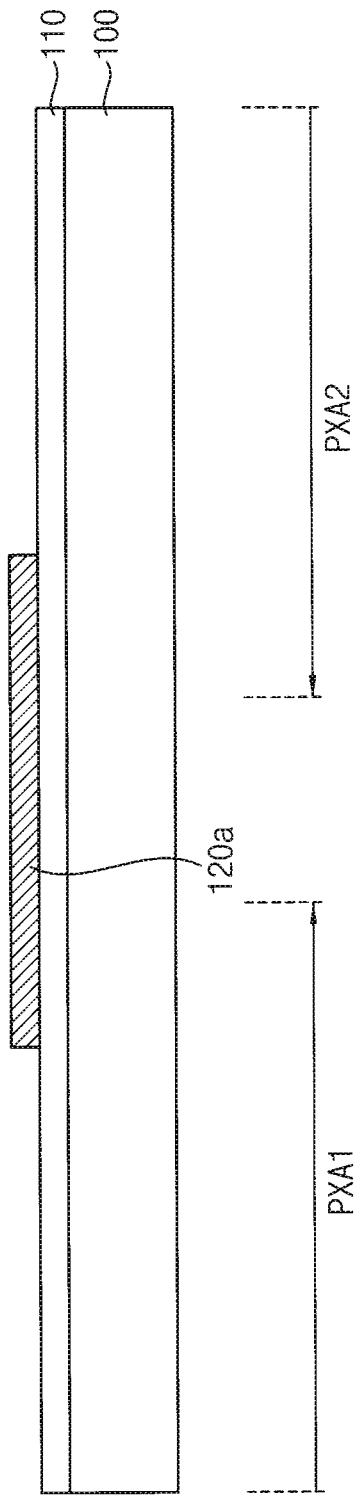
FIGS. 13, 14, 15, 16, and 17 are cross-sectional views illustrating a method of manufacturing a display device according to an embodiment.
Figure 14:
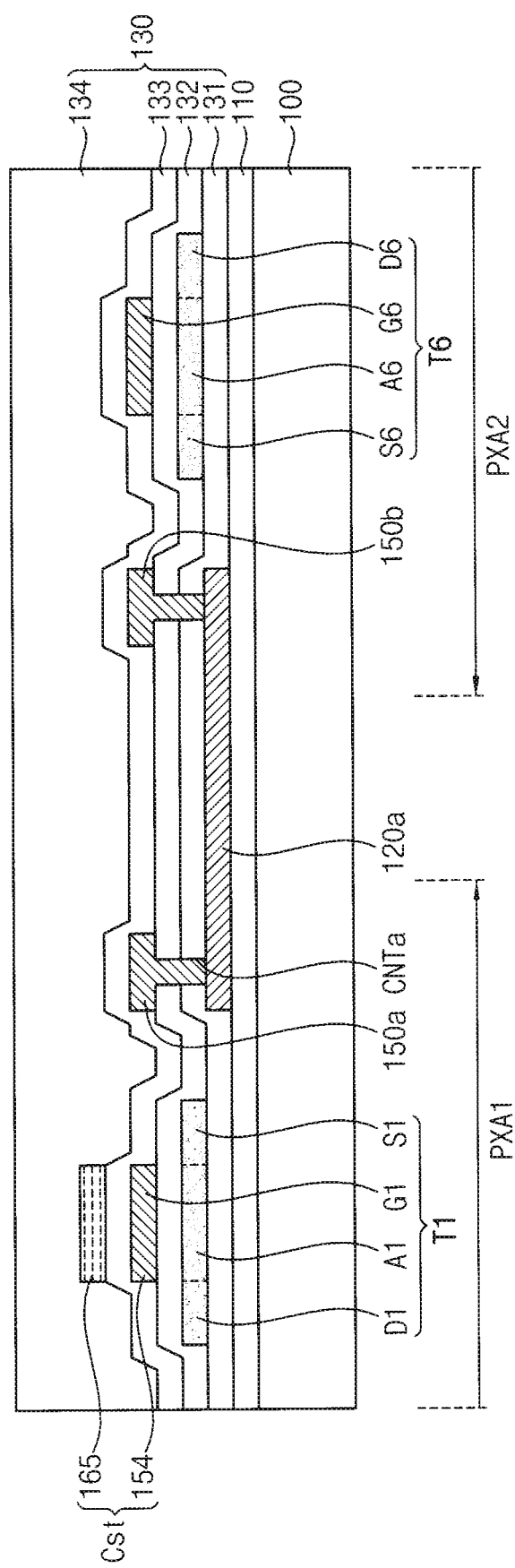

Referring to FIGS. 5 and 13, the lower connection line (the first conductive layer) 120 may be formed on the substrate 100.

First, the bather layer 110 may be formed by depositing an inorganic insulating material on the substrate 110. Then, a conductive material may be deposited on the bather layer 110 and patterned to form the lower connection line 120.

Since the lower connection line 120 may expose to high-temperature process for forming the semiconductor layer 140 which includes heat treatment, the conductive material may include a metal having a relatively high melting point such as molybdenum (Mo), titanium (Ti), or the like. Further, since the lower connection line 120 extends relatively long, the conductive material may include a material having a high elongation rate.

Referring to FIGS. 6, 7, 8, and 14, the inorganic insulating layer 130 including the buffer layer 131, the first inorganic insulating layer 132, the second inorganic insulating layer 133 and the third inorganic insulating layer 134, the semiconductor layer 140, the second conductive layer 150, and the third conductive layer 160 may be formed on the substrate 100 on which the lower connection line 120 is formed.

First, the buffer layer 131 may be formed by depositing an inorganic insulating material on the bather layer 110 on which the lower connection line 120 is formed. Then, a semiconductor material may be deposited on the buffer layer 131 and patterned to form the semiconductor layer 140. Then, the first insulating layer 132 may be formed by depositing an inorganic insulating material on the buffer layer 131 on which the semiconductor layer 140 is formed.

Then, the contact holes CNT1a, CNT1b, CNT2a, CNT2b, CNT3a, and CNT3b formed through the buffer layer 131 and the first inorganic insulating layer 132 may be formed by a photo mask process, or the like. Then, a conductive material may be deposited on the first inorganic insulating layer 132 and patterned to form the second conductive layer 150. Then, the second inorganic insulating layer 133 may be formed by depositing an inorganic insulating material on the first inorganic insulating layer 132 on which the second conductive layer 150 is formed.

Then, the contact holes CNT4a, CNT4b, CNT5a, CNT5b, CNT6a, and CNT6b formed through the buffer layer 131, the first inorganic insulating layer 132, and the second inorganic insulating layer 133 may be formed by a photo mask process, or the like. Then, a conductive material may be deposited on the second inorganic insulating layer 133 and patterned to form the third conductive layer 160. Then, the third inorganic insulating layer 134 may be formed by depositing an inorganic insulating material on the second inorganic insulating layer 133 on which the third conductive layer 160 is formed.

Figure 15:
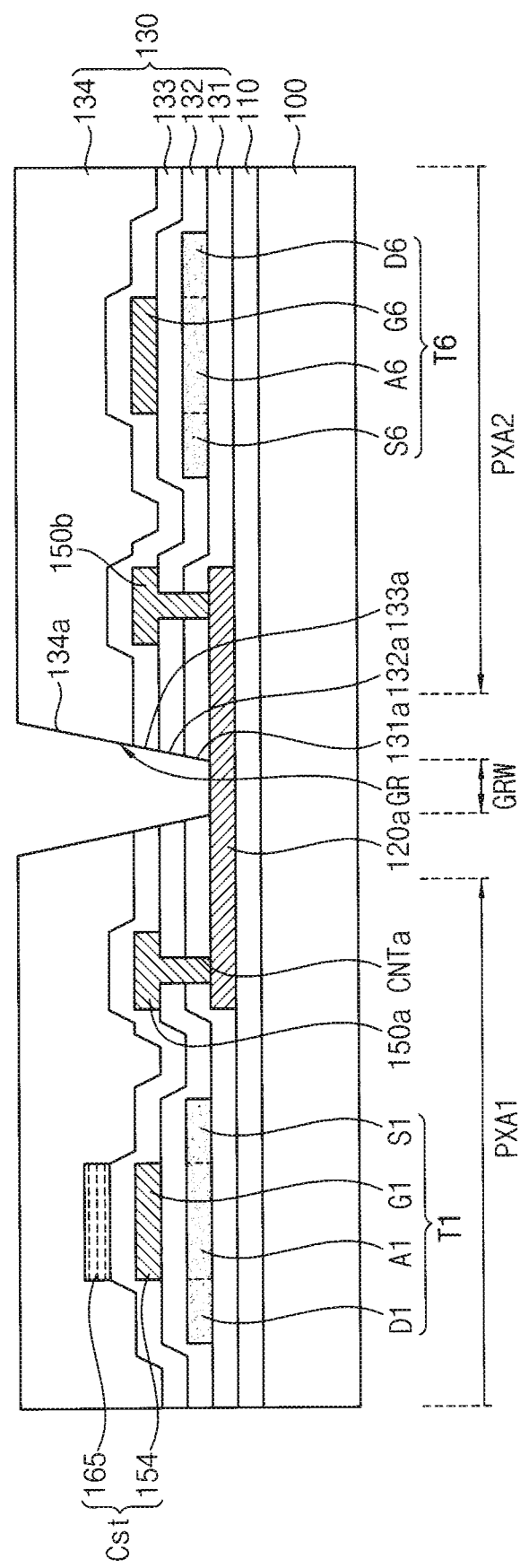

Referring to FIG. 15, the groove GR may be formed in the inorganic insulating layer 130. The groove GR of the inorganic insulating layer 130 may be formed between the pixel areas PXA1, PXA2, and PXA3. In order to form the groove GR in the inorganic insulating layer 130, a photo mask process and an etching process may be performed. The openings 131a, 132a, 133a, and 134a of the buffer layer 131, the first inorganic insulating layer 132, the second inorganic insulating layer 133, and the third inorganic insulating layer 134 may be formed by the etching process. For example, the etching process may be a dry etching process.

Figure 16:
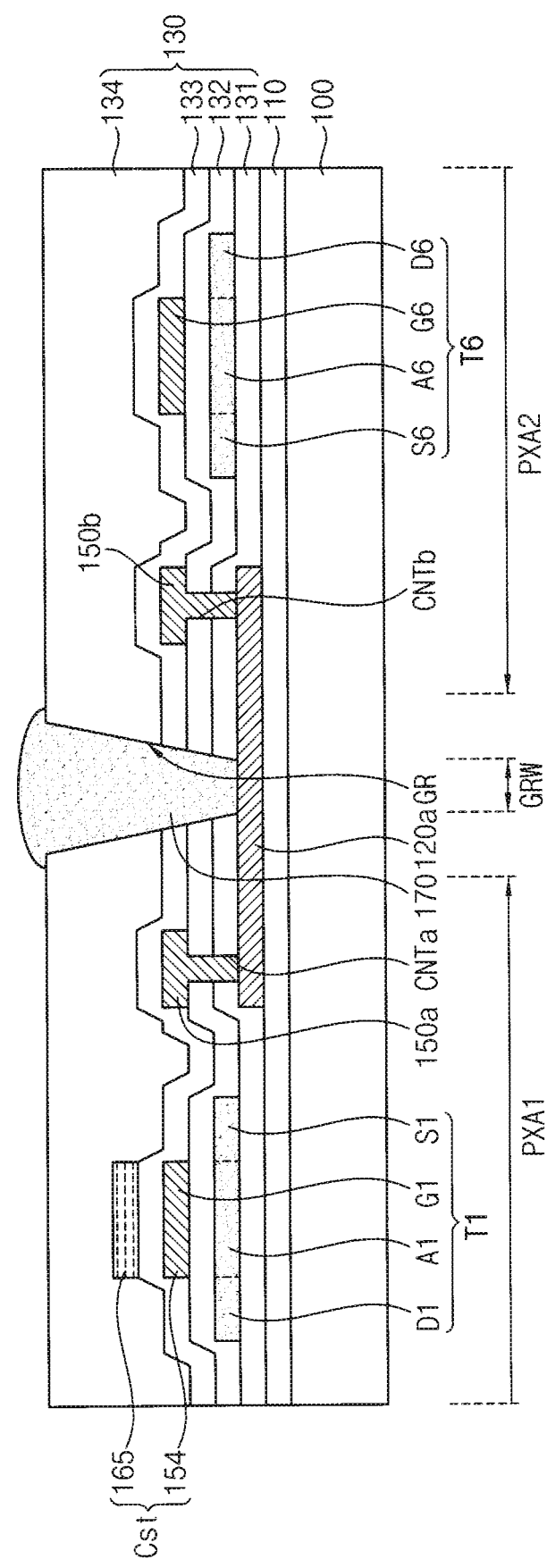

Referring to FIG. 16, the organic insulating layer 170 filling the groove GR of the inorganic insulating layer 130 may be formed. For example, an organic insulating material may be deposited on the third inorganic insulating layer 134 and patterned to form the organic insulating layer 170. However, the patterning of the organic insulating layer 170 may be omitted. In this case, the organic insulating layer 170 may be remained on the third inorganic insulating layer 134 to completely cover the third inorganic insulating layer 134.

Figure 9:
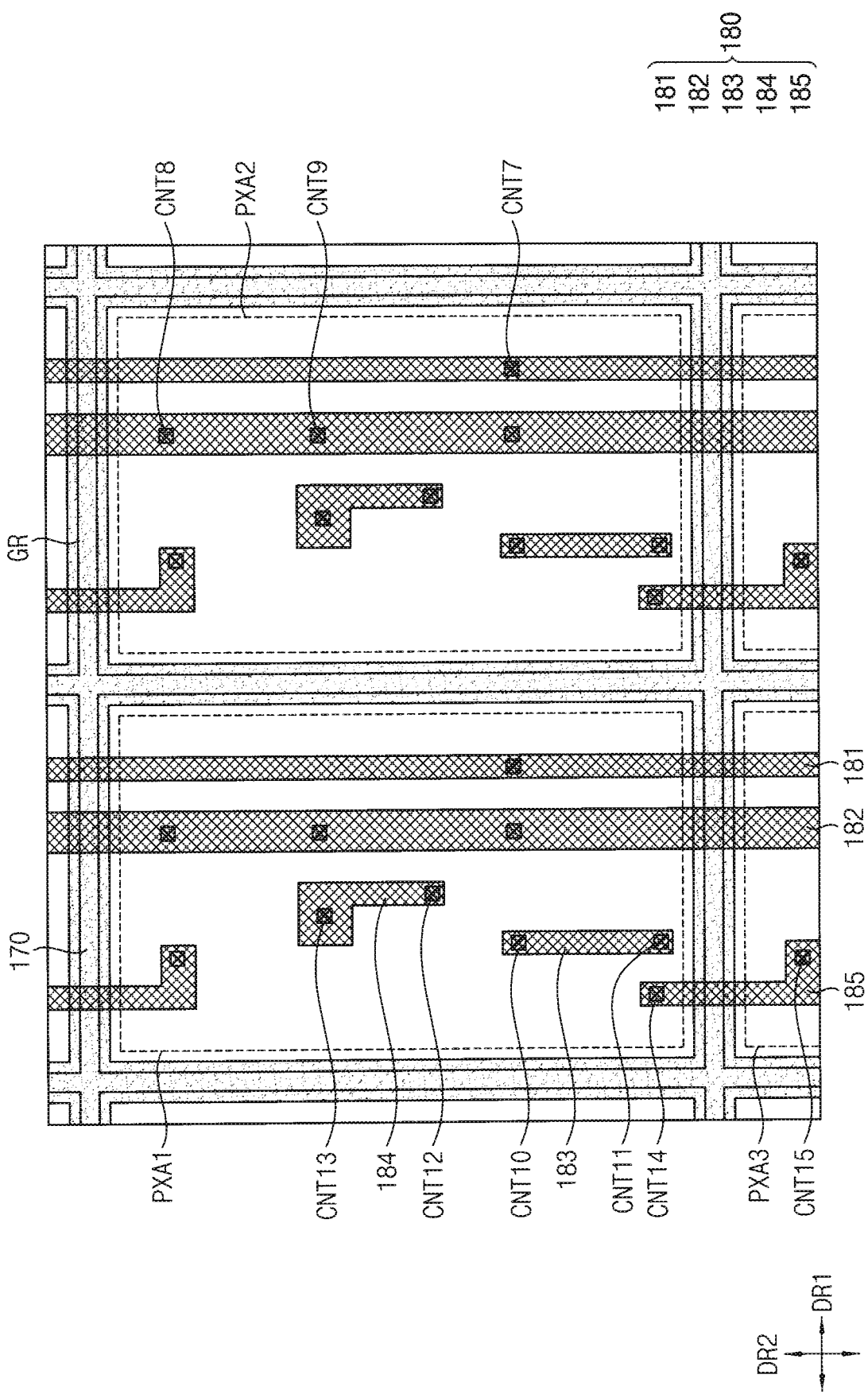
Figure 17:
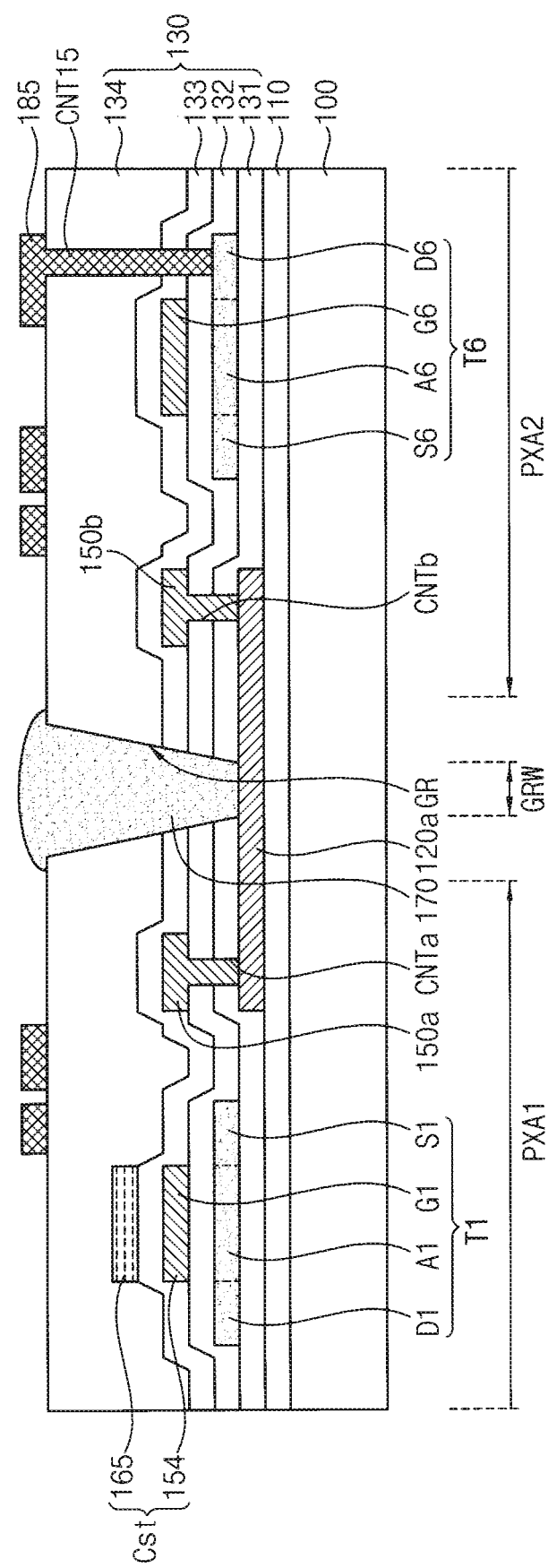

Referring to FIGS. 9 and 17, the upper connection line (the fourth conductive layer) 180 may be formed on the inorganic insulating layer 130 in which the groove GR is filled with the organic insulating layer 170.

Then, the contact holes CNT7, CNT8, CNT10, CNT12, CNT14, and CNT15 formed through the first to third inorganic insulating layers 132, 133 and 134, the contact hole CNT13 passing through the second and third inorganic insulating layers 133 and 134, and the contact holes CNT9 and CNT11 formed through the third inorganic insulating layer 134 may be formed by a photo mask process, or the like. Then, a conductive material may be deposited on the inorganic insulating layer 130 and the organic insulating layer 170 and patterned to form the upper connection line 180. Since the upper connection line 180 extends relatively long, the conductive material may include a material having a high elongation rate. The high-temperature process for forming the semiconductor layer 140 which includes heat treatment may be performed after forming the semiconductor layer 140 and before forming the upper connection line 180.

Figure 18:
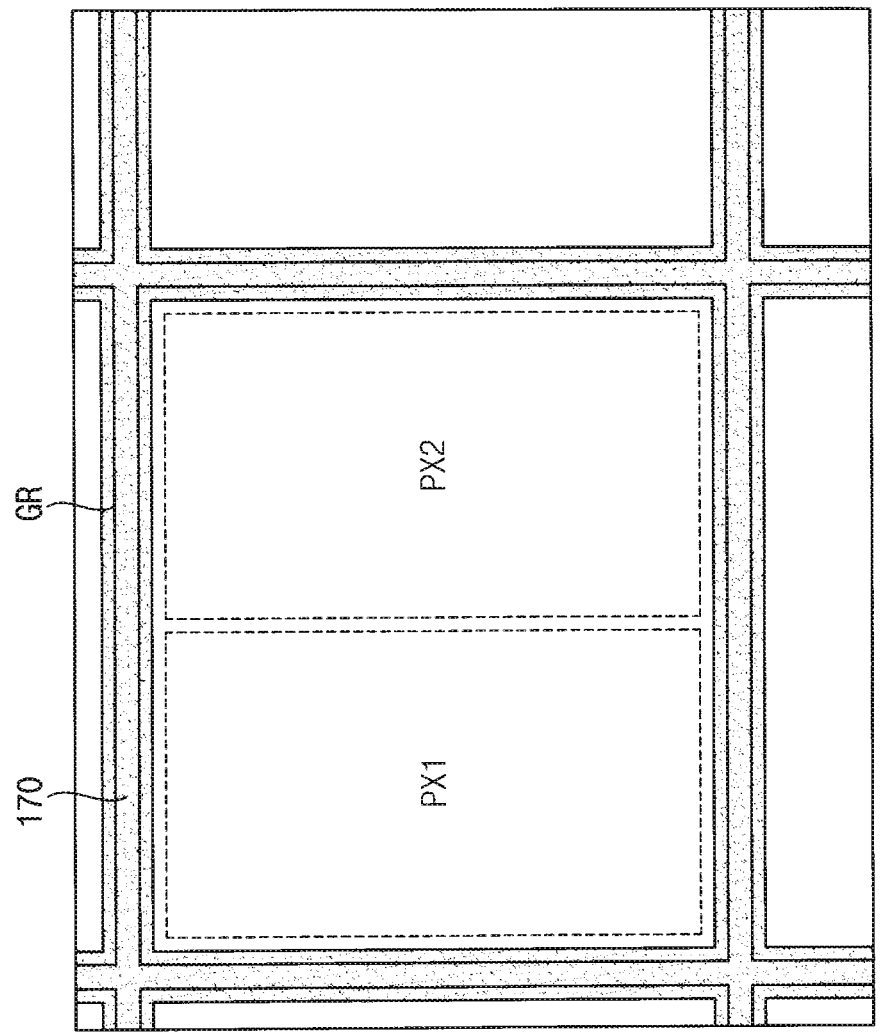

FIGS. 18 and 19 are plan views illustrating a display device according to embodiments.

Referring to FIGS. 18 and 19, the grooves GR of the inorganic insulating layer and the organic insulating layer 170 may be disposed to surround a plurality of pixels. In an embodiment, as illustrated in FIG. 18, the groove GR of the inorganic insulating layer and the organic insulating layer 170 may be disposed to surround two pixels, that is, the first pixel PX1 and the second pixel PX2. In another embodiment, as illustrated in FIG. 19, the groove GR of the inorganic insulating layer and the organic insulating layer 170 may be disposed to surround four pixels PX1, PX2, PX3, and PX4. However, embodiments of the present inventive concept are not limited thereto, and the number of pixels to be grouped may be variously modified.

The number of pixels surrounded by the groove GR of the inorganic insulating layer and the organic insulating layer 170 may be the same or different according to positions in one display device. For example, the groove GR of the inorganic insulating layer and the organic insulating layer 170 may be disposed to surround one pixel in a region subject to a high risk of cracks or stress, and may be disposed to surround a plurality of pixels in another region.

The display device according to the embodiments of the present inventive concept may be applied to a display device included in a computer, a notebook, a mobile phone, a smartphone, a smart pad, a PMP, a PDA, an MP3 player, or the like.

Although the display devices according to the embodiments of the present inventive concept have been described with reference to the drawings, the illustrated embodiments are examples, and may be modified and changed by a person having ordinary knowledge in the relevant technical field without departing from the technical spirit of the present inventive concept described in the following claims.

The invention claimed is:

1. A display device, comprising:
 a first pixel area on which a first pixel is disposed;
 a second pixel area on which a second pixel is disposed, the second pixel area being disposed adjacent to the first pixel area along a first direction;
 a lower connection line connecting the first pixel and the second pixel, and crossing the first pixel area and the second pixel area;
 an inorganic insulating layer disposed on the lower connection line and having a groove disposed between the first pixel area and the second pixel area, and exposing an upper surface of the lower connection line; and
 an organic insulating layer filling the groove of the inorganic insulating layer.

2. The display device of claim 1, wherein the lower connection line extends along the first direction, and
 wherein the groove of the inorganic insulating layer extends along a second direction intersecting the first direction.

3. The display device of claim 1, wherein the first pixel and the second pixel respectively include a first conductive line and a second conductive line disposed on the lower connection line with the organic insulating layer disposed between the first conductive line and the second conductive line.

4. The display device of claim 3, wherein the first conductive line and the second conductive line are connected by the lower connection line.

5. The display device of claim 4, wherein the lower connection line is connected to a scan line or an emission control line.

6. The display device of claim 3, wherein the first pixel and the second pixel respectively include a third conductive line and a fourth conductive line respectively disposed on the lower connection line with the organic insulating layer disposed between the third conductive line and the fourth conductive line.

7. The display device of claim 6, wherein the third conductive line and the fourth conductive line are connected by the lower connection line.

8. The display device of claim 7, wherein the lower connection line is connected to an initialization voltage line.

9. The display device of claim 6, wherein the lower connection line includes:
 a first lower connection line connecting the first conductive line and the second conductive line; and
 a second lower connection line connecting the third conductive line and the fourth conductive line.

10. The display device of claim 6, wherein an elongation rate of the lower connection line is greater than an elongation rate of the third conductive line and an elongation rate of the fourth conductive line.

11. The display device of claim 3, wherein an elongation rate of the lower connection line is greater than an elongation rate of the first conductive line and an elongation rate of the second conductive line.

12. The display device of claim 1, further comprising:
 a third pixel area on which a third pixel is disposed, the third pixel area being disposed adjacent to the first pixel area along a second direction intersecting the first direction; and
 an upper connection line disposed on the inorganic insulating layer and the organic insulating layer, connecting the first pixel and the third pixel, and crossing the first pixel area and the third pixel area.

13. The display device of claim 12, wherein the groove of the inorganic insulating layer extends along the first direction, and
wherein the upper connection line extends along the second direction.

14. The display device of claim 12, wherein the upper connection line is connected to a data line or a power voltage line.

15. The display device of claim 12, wherein a melting point of the lower connection line is greater than a melting point of the upper connection line.

16. A display device, comprising:
a substrate, the substrate including a first pixel area and a second pixel area disposed adjacent to the first pixel area along a first direction;
a first lower connection line disposed on the substrate and crossing the first pixel area and the second pixel area;
a first inorganic insulating layer disposed on the first lower connection line and having a first opening disposed between the first pixel area and the second pixel area;
a first conductive line disposed on the first inorganic insulating layer in the first pixel area and being connected to the first lower connection line through a first contact hole formed through the first inorganic insulating layer;
a second conductive line disposed on the first inorganic insulating layer in the second pixel area and being connected to the first lower connection line through a second contact hole formed through the first inorganic insulating layer;
a second inorganic insulating layer disposed on the first conductive line and the second conductive line, and having a second opening overlapping the first opening in a plan view; and
an organic insulating layer filling the first opening of the first inorganic insulating layer and the second opening of the second inorganic insulating layer.

17. The display device of claim 16, further comprising:
a second lower connection line disposed on a same layer as the first lower connection line and crossing the first pixel area and the second pixel area;
a third conductive line disposed on the second inorganic insulating layer in the first pixel area and being connected to the second lower connection line through a third contact hole formed through the first inorganic insulating layer and the second inorganic insulating layer; and
a fourth conductive line disposed on the second inorganic insulating layer in the second pixel area and being connected to the second lower connection line through a fourth contact hole formed through the first inorganic insulating layer and the second inorganic insulating layer.

18. The display device of claim 16, further comprising:
a third pixel area disposed adjacent to the first pixel area along a second direction; and
an upper connection line disposed on the second inorganic insulating layer and crossing the first pixel area and the third pixel area.

19. A display device, comprising:
a plurality of pixel areas;
a lower connection line crossing the plurality of pixel areas;
an inorganic insulating layer disposed on the lower connection line and having a groove disposed between adjacent pixel areas of the plurality of pixel areas and exposing an upper surface of the lower connection line; and
an organic insulating layer filling the groove of the inorganic insulating layer.

20. The display device of claim 19, wherein the organic insulating layer surrounds at least a portion of the plurality of the pixel areas in a plan view.

21. The display device of claim 19, wherein the organic insulating layer completely surrounds each of the plurality of the pixel areas in a plan view.

22. The display device of claim 19, further comprising:
an upper connection line disposed on the inorganic insulating layer and the organic insulating layer, crossing the plurality of pixel areas, and intersecting the lower connection line.

23. A display device, comprising:
a substrate, the substrate including a first pixel area on which a first pixel is disposed and a second pixel area on which a second pixel is disposed, emission areas of the first pixel and the second pixel each being defined by an opening of a pixel defining layer in which an emission layer is disposed between a pixel electrode and an opposite electrode;
a lower connection line disposed on the substrate and crossing the first pixel area and the second pixel area;
an inorganic insulating layer disposed on the lower connection line and having a groove disposed between the first pixel area and the second pixel area and exposing an upper surface of the lower connection line; and
an organic insulating layer disposed between the lower connection line and the pixel defining layer, and filling the groove of the inorganic insulating layer.

* * * * *